(12) United States Patent
Hsueh

(10) Patent No.: US 12,364,005 B2
(45) Date of Patent: Jul. 15, 2025

(54) STACKED MULTILAYER 3D GAN HIGH ELECTRON MOBILITY TRANSISTOR STRUCTURE AND PROCESS METHOD

(71) Applicant: Nanjing Greenchip Semiconductor Co., Ltd., Nanjing (CN)

(72) Inventor: Kuang-Po Hsueh, Nanjing (CN)

(73) Assignee: Nanjing Greenchip Semiconductor Co., Ltd., Nanjing (CN)

( * ) Notice: Subject to any disclaimer, the term of this patent is extended or adjusted under 35 U.S.C. 154(b) by 363 days.

(21) Appl. No.: 17/993,978

(22) Filed: Nov. 24, 2022

(65) Prior Publication Data

US 2024/0145478 A1  May 2, 2024

(30) Foreign Application Priority Data

Oct. 28, 2022 (CN) .......................... 202211331691.4

(51) Int. Cl.
| | | |
|---|---|---|
| *H10D 84/86* | (2025.01) | |
| *H10D 30/01* | (2025.01) | |
| *H10D 30/47* | (2025.01) | |
| *H10D 62/824* | (2025.01) | |
| *H10D 62/85* | (2025.01) | |
| *H10D 84/05* | (2025.01) | |

(52) U.S. Cl.
CPC ........... *H10D 84/86* (2025.01); *H10D 30/015* (2025.01); *H10D 30/475* (2025.01); *H10D 62/824* (2025.01); *H10D 62/8503* (2025.01); *H10D 84/05* (2025.01)

(58) Field of Classification Search
CPC .... H10D 84/86; H10D 30/015; H10D 30/475; H10D 62/824; H10D 62/8503; H10D 84/05; H10D 62/378; H10D 10/01; H10D 62/10; H10D 84/406; H10D 84/87; H10D 18/60; H10D 84/0195; A01G 13/24; A01G 13/33; A01N 1/124; H10H 20/818; H10H 20/8314; A23B 2/783; B65D 83/166

See application file for complete search history.

(56) References Cited

U.S. PATENT DOCUMENTS

2022/0037515 A1* 2/2022 Zhang ................. H10D 84/40
2023/0343693 A1* 10/2023 Wu ..................... H10D 64/258

* cited by examiner

*Primary Examiner* — Mohammad A Rahman
(74) *Attorney, Agent, or Firm* — Chih Feng Yeh; Yongjean Consulting Inc.

(57) ABSTRACT

A GaN HEMT with a stacked multilayer 3D structure is proposed, which is formed by re-growing a GaN layer, fabricated a second HEMT on a dielectric protective layer and connected the source, gate or drain electrodes of the respective GaN HEMT. Process is repeated to form at least three layers GaN HEMT structure, one stacked on top of the other, with each electrode of individual GaN HEMT connected by a deep etching process. Bonding pads of the HEMT device are formed on the uppermost layer of the device. The multilayer 3D GaN HEMT device will be manufactured based on stacking one layer of GaN HEMT following one layer of protection layer. In this way, the layout area of the GaN HEMT device can be reduced and the current density per unit area can be increased, thereby reducing the overall packaged volume.

13 Claims, 28 Drawing Sheets

STACKED MULTILAYER 3D GAN HIGH ELECTRON MOBILITY TRANSISTOR STRUCTURE AND PROCESS METHOD

CROSS-REFERENCE STATEMENT

The present application claims the benefit of China Patent Application Serial Number 202211331691.4 filed on Oct. 28, 2022, which is herein incorporated by reference.

TECHNICAL FIELD

The present invention relates to technology field of manufacturing Gallium Nitride transistors, and more particularly, a stacked multilayer 3D GaN high electron mobility transistor (HEMT) structure and process method.

BACKGROUND

Normally-off or Normally-on GaN-based high electron mobility transistor (HEMT) has three electrodes: source, drain, and gate. Currently, the GaN-based transistor is to utilize two-dimensional electron gas (2DEG) as a channel for device operation, and the transistor is of a planar structure.

FIG. 1 illustrates a cross-sectional view of a multilayered epitaxial structure of a conventional Normally-off or Normally-on GaN-based HEMT. The multilayered epitaxial structure from bottom to top includes a substrate 104, a n-type gallium nitride (GaN) layer 103, an aluminum gallium nitride (AlGaN) layer 102, a gallium nitride (GaN) cap layer or a p-type gallium nitride (GaN) layer 101.

FIG. 2 illustrates a cross-sectional view of a conventional Normally-off or Normally-on GaN-based HEMT structure. The conventional Normally-off or Normally-on GaN-based HEMT structure includes a substrate 204, a n-type gallium nitride (GaN) layer 203, an aluminum gallium nitride (AlGaN) layer 202, a gallium nitride (GaN) cap layer or a p-type gallium nitride (GaN) layer 201, where the interface between the GaN layer 203 and the AlGaN layer 202 will form a two-dimensional electron gas (2DEG), a gate metal 207, a drain metal 205, a source metal 206, a protection layer 215, source and drain contact metal 208, a gate contact metal 209; a drain metal pad, a source metal pad 212, a gate metal pad 210, and a back electrode 213 fabricated after polished the back side of the substrate 204.

In the conventional normally-off or normally-on GaN HEMT, the transistor is of a planar type. However, the planar type transistor usually means that the transistor has a larger layout area and package volume, and a smaller current density per unit area.

For low-resistance applications of GaN power transistors, the gate width (Wg) of the device is usually increased. As the gate width increases, the size of the device also increases.

To meet the requirements of smaller size and device resistance in high power applications, a novel structure of GaN HEMT and its fabrication method is needed.

SUMMARY

One object of the present invention is to propose a novel GaN HEMT structure to reduce device's layout area and package volume and to increase device's current density per unit area.

Another object of the present invention is to propose a corresponding method for fabricating the proposed GaN HEMT.

Based on these purposes, a stacked multilayer 3D GaN high electron mobility transistor (HEMT) structure is proposed, which includes a substrate, a first layer GaN HEMT structure formed on the substrate, which includes a first n-type GaN layer, a first n-type AlGaN layer, and a first doped GaN layer arranged to form on the substrate in sequence, wherein the first doped GaN layer is a p-type GaN layer (for e-mode p-GaN gate) or an n-type GaN layer (for d-mode cap layer); a first source electrode been formed on the first n-type AlGaN layer and making ohmic contact with the first n-type AlGaN layer, a first drain electrode been formed on the first n-type AlGaN layer not overlapping the first source electrode and making ohmic contact with the first n-type AlGaN layer, and a first gate electrode been formed on the first doped GaN layer not overlapping the first source electrode and the first drain electrode; a first dielectric layer formed on the first layer GaN HEMT structure; a second layer GaN HEMT structure formed on the first dielectric layer including: a second n-type GaN layer, a second n-type AlGaN layer, and a second doped GaN layer arranged to form on the first dielectric layer in sequence, wherein the second doped GaN layer is a p-type GaN layer or an n-type GaN layer; a second source electrode been formed on the second n-type AlGaN layer and making ohmic contact with the second n-type AlGaN layer, a second drain electrode been formed on the second n-type AlGaN layer not overlapping the second source electrode and making ohmic contact with the second n-type AlGaN layer, and a second gate electrode been formed on the second doped GaN layer not overlapping the second source electrode and the second drain electrode; a second dielectric layer formed on the second layer GaN HEMT structure; and a source metal interconnection structure, a drain metal interconnection structure and a gate metal interconnection structure been formed to respectively connect between the first source electrode, the first drain electrode and the first gate electrode of the first layer GaN HEMT structure and the second source electrode, the second drain electrode and the second gate electrode of the second layer GaN HEMT structure. By repeating the aforementioned manufacturing process that the second layer GaN HEMT structure has been formed on the topmost dielectric layer of the first layer GaN HEMT, subsequent layer GaN HEMT structure can be formed. The GaN HEMT having more stacked layers of GaN HEMT structure can be formed and be shrunk to smaller die sizes.

In one preferred embodiment, the stacked multilayer 3D GaN HEMT structure further including a third layer GaN HEMT structure formed on said second dielectric layer.

In one preferred embodiment, material of the substrate includes a group consisting of Aluminum Oxide ($Al_2O_3$), Silicon Carbide (SiC), Zinc Oxide (ZnO), Silicon substrate (Si), Gallium Nitride, Aluminum Gallium Nitride ($Al_xGa_{1-x}N$), Indium Gallium Nitride ($In_xGa_{1-x}N$), and Aluminum Indium Gallium Nitride ($In_xAl_yGa_{1-x-y}N$), where x, y are the contents ($0 \leq x \leq 1$, $0 \leq y \leq 1$).

In one preferred embodiment, method for forming the first n-type GaN layer, the first n-type AlGaN layer, the first doped GaN layer, the second n-type GaN layer, the second n-type AlGaN layer and the second doped GaN layer includes molecular beam epitaxy (MBE) or metalorganic vapor phase epitaxy (MOVPE).

In one preferred embodiment, the source metal interconnection structure, the drain metal interconnection structure and the gate metal interconnection structure are fabricated by deep etching and metal deposition processes.

In one preferred embodiment, materials for making the first source electrode, the first drain electrode, the gate electrode, the second source electrode, the second drain electrode, and the second gate electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

According to another aspect of the present invention, the present invention provides a method for manufacturing a stacked multilayer 3D GaN HEMT structure, the method comprises: providing a substrate; forming a first layer GaN HEMT, which includes: forming a first multilayer epitaxial structure on the substrate, the first multilayer epitaxial structure been formed by sequentially growing a first n-type GaN layer, a first n-type AlGaN layer, and a first doped GaN layer on the substrate, wherein the first doped GaN layer is a p-type GaN layer or an n-type GaN layer; defining a first layer device area; defining a first layer gate region on the first doped GaN layer; forming a first drain metal region and a first source metal region on the first n-type AlGaN layer; forming a first gate metal on the first layer gate region; forming a first protection layer on the first n-type AlGaN layer, the first drain metal, the first source metal and the first gate metal; forming a plurality of first layer through holes in the first protective layer by a photomask and etching process for respectively connecting the first drain metal, the first source metal and the first gate metal to outside of the first protective layer; forming a first dielectric layer to cover the first layer GaN HEMT; forming a second layer GaN HEMT by the similar steps as previous described, then forming a second protection layer; forming a plurality of second layer through holes in the second protective layer by a photomask and an etching process for respectively connecting the second drain metal, the second source metal and the second gate metal to outside of the second protective layer; forming a source metal interconnection structure, a drain metal interconnection structure and a gate metal interconnection structure to respectively connect between the first source electrode, the first drain electrode and the first gate electrode of the first layer GaN HEMT structure and the second source electrode, the second drain electrode and the second gate electrode of the second layer GaN HEMT structure; forming a second dielectric layer to cover the second layer GaN HEMT.

In one preferred embodiment, the method for manufacturing a stacked multilayer 3D GaN HEMT structure, further includes forming a third layer GaN HEMT structure on the second dielectric layer.

In one preferred embodiment, forming the source metal interconnection structure, the drain metal interconnection structure and the gate metal interconnection structure includes utilizing a photomask and a deep etching process.

In one preferred embodiment, the method for manufacturing a stacked multilayer 3D GaN HEMT structure, further includes forming a corresponding metal interconnection structure connecting source electrode, drain electrode and gate electrode of each layer of the GaN HEMT structure.

In one preferred embodiment, the method for manufacturing a stacked multilayer 3D GaN HEMT structure, further includes forming the uppermost dielectric layer as a protective layer.

In one preferred embodiment, the corresponding metal internal connection structures connecting the source electrode, the drain electrode and the gate electrode of each layer of the GaN HEMT structure are staggered and do not overlap each other.

In one preferred embodiment, the uppermost dielectric layer is etched to expose the corresponding metal interconnection structure to form PAD regions and then a metal deposition process is performed to form a source PAD, a drain PAD and gate PAD over the uppermost dielectric layer.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Figure 1:
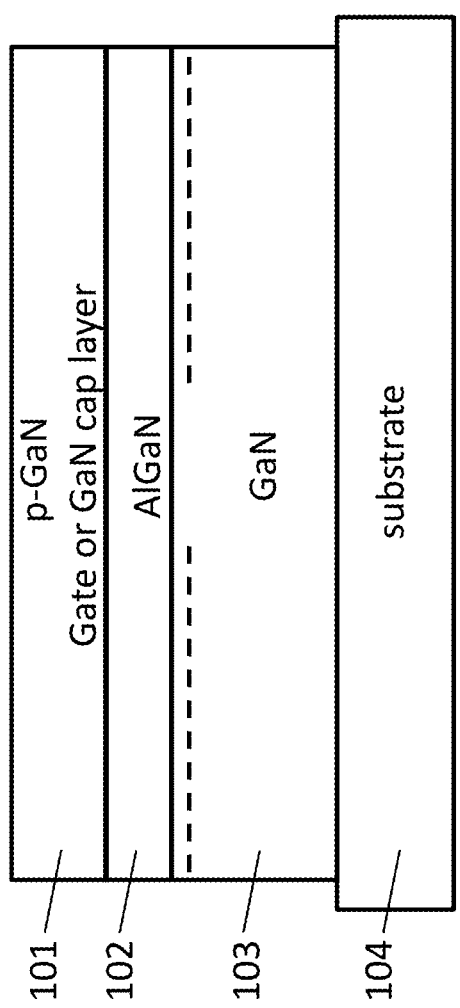
FIG. 1 illustrates a cross-sectional view of a multilayered epitaxial structure of a conventional Normally-off or Normally-on GaN-based HEMT.
Figure 2:
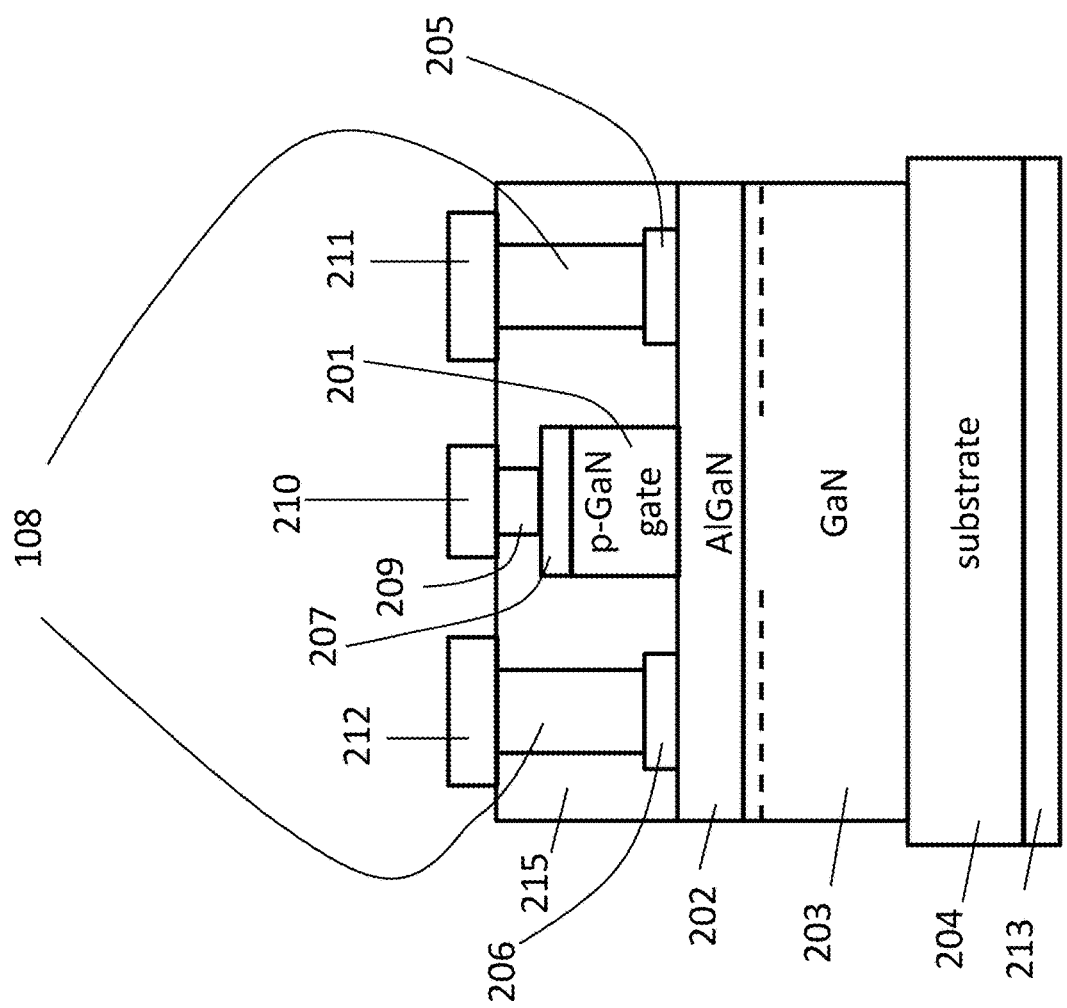
FIG. 2 illustrates a cross-sectional view of a conventional normally-off or normally-on GaN-based HEMT structure.

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Conventional normally-off or normally-on GaN high electron conductivity transistor (HEMT) has three electrodes, i.e. source, drain, and gate electrodes. The current device is to use a two-dimensional electron gas (2DEG) as a channel. Since the conventional HEMT has a planar structure, in order to solve the technical problem that the conventional planar normally-off or normally-on GaN HEMT is not conducive to high power, small size and low resistance applications.

Under the demands of the same current and channel resistance, in order to reduce the area occupied during the device process, the present invention proposes to re-grow a gallium nitride layer on the dielectric protection layer, and to form a stacked multi-layer 3D structure, the size of the layout is therefore reduced. The device will be a 3D stacked architecture with a layer of gallium nitride and a protective layer. In this way, in addition to reducing the layout area during device process, the current density per unit area of the HEMT is also improved, therefore, for high-power applications of gallium nitride HEMT, the volume of the packaged products can be made smaller, and the area of the used wafer can be reduced, causing the overall cost of single HEMT device.

The present invention provides a method of re-growing a GaN layer on a dielectric protective layer to form a normally-off or normally-on GaN HEMT with a stacked multilayer 3D structure. In the process integration method, the source, gate or drain electrodes of the respective gallium nitride layers can be connected to form a stacked multi-layer 3D structure. The method is described as follows: after fabricating the first-layer GaN HEMT, the second-layer GaN HEMT device structure is re-grown by using the oxide layer on the upper layer of the first-layer GaN HEMT device as a second-layer substrate. The overall device is fabricated by the same process, and at least three device layer structures are formed, and then the electrodes of each device layer are connected together by a deep etching process, and the bonding pads of the device are fabricated on the uppermost layer. The device will be formed based on a stack of one layer of gallium nitride and one layer of protection oxide. In this way, the layout area for processing device can be reduced and the current density per unit area of the device can be increased, thereby reducing the volume of the packaged product.

With regard to the techniques, means and effects of the present invention, a preferred embodiment is hereby listed and described in detail with the drawings. It is believed that the above-mentioned purposes, structures and features of the present invention can be obtained from them for a thorough and specific understanding.

Figure 3:
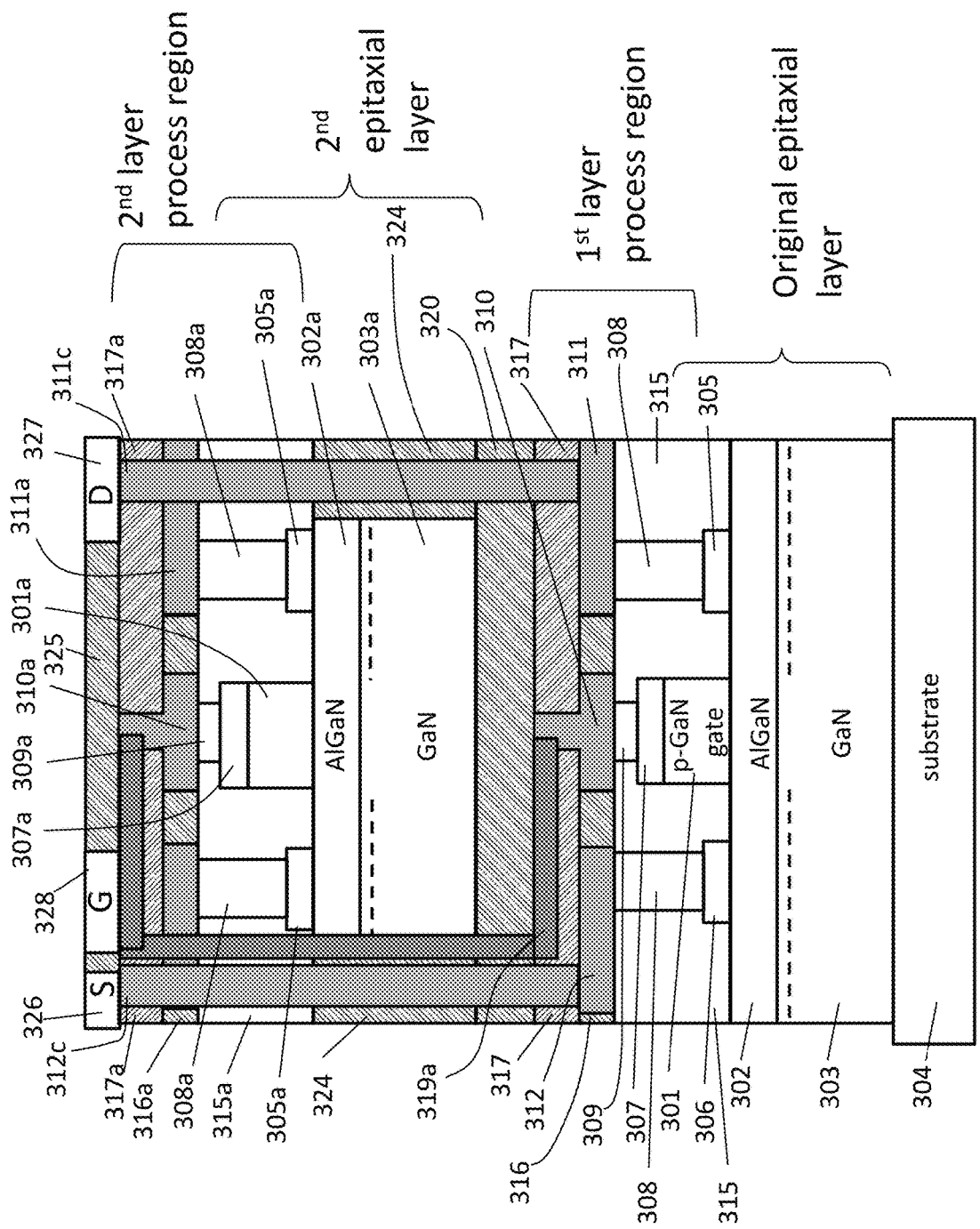
FIG. 3 illustrates a normally-off or normally-on GaN HEMT having a stacked multilayer 3D structure according to one embodiment of the present invention.

The structure shown in FIG. 3 is a normally-off or normally-on GaN HEMT having a stacked multilayer 3D structure according to an embodiment of the present invention. Referring to FIG. 3, the transistor structure in the figure is fabricated by re-growing an epitaxial gallium nitride layer, which has more than two layer HEMT device structure. Each electrode of the transistor device is connected to the uppermost pad (PAD) metal region by means of deep etching.

A normally-off or normally-on GaN HEMT having a stacked multilayer 3D structure as shown in FIG. 3 includes:
(a) a substrate 304;
(b) a first layer normally-off or normally-on GaN HEMT structure formed on the substrate 304, where the first layer normally-off or normally-on GaN HEMT structure includes: a low-doped n type GaN layer 303 formed on the substrate 304; a low-doped n-type AlGaN layer 302 formed on the low-doped n-type GaN layer 303; a p-type GaN layer (normally-off) or n-type GaN layer (normally-on) 301 formed on the low-doped n-type AlGaN layer 302; a source electrode 306, a drain electrode 305, and a gate electrode 307 respectively formed on the source region, the drain region located on the low-doped n-type AlGaN layer 302, and the gate region located on the p-type GaN layer (normally-off) or n-type GaN layer (normally-on) 301; a dielectric layer 320 formed to cover the first layer normally-off or normally-on HEMT structure (the first layer device) and utilizing epitaxial growth method to form epitaxial layers of a second layer device;
(c) a second layer normally-off or normally-on HEMT structure fabricated on the dielectric layer 320 includes: a low-doped n-type GaN layer 303a formed on the dielectric layer 320; a low-doped n-type AlGaN layer 302a formed on the low-doped n-type GaN layer 303a; a p-type GaN layer (normally off) or an n-type GaN layer (normally on) formed on the low-doped n-type AlGaN layer 302a; the source electrode 306a, the drain electrode 305a, and the gate electrode 307a respectively formed on the source region, the drain region located on the low-doped n-type AlGaN layer 302a, and the gate region located on the p-type GaN layer (normally-off) or n-type GaN layer (normally-on) 301a; a dielectric layer formed to cover the second layer normally-off or normally-on HEMT structure (the second layer device) and utilizing epitaxial growth method to form epitaxial layers above the second layer device for fabricating subsequent layer device or only two-layer HEMT device stacking; where the stacked device structure is formed by stacking (a), (b), and (c) structures sequentially from bottom to top;
(d) the process after completing all the stacked device structure further includes the following steps: utilizing a deep etching process to connect the metal of each layer of source and drain (311c and 312c); utilizing another deep etching process to connect the metal of each layer of gate 310c; an uppermost dielectric layer formed to use as a device protection layer 325; a source pad (PAD) metal 326, a drain PAD metal 327, and a gate PAD metal 328 formed on the source, drain and gate electrodes, respectively.

According to one embodiment of the present invention, the normally-off or normally-on GaN HEMT with a stacked multilayer 3D structure and related process integration method proposed, the method for forming epitaxial GaN/AlGaN layers includes molecular beam epitaxy (MBE) or metalorganic vapor phase epitaxy (MOVPE).

According to one embodiment of the present invention, the normally-off or normally-on GaN HEMT with a stacked multilayer 3D structure and related process integration method proposed, the material of the semi-insulating crystal growth substrate includes the group consisting of Aluminum Oxide ($Al_2O_3$), Silicon Carbide (SiC), Zinc Oxide (ZnO), Silicon substrate (Si), Gallium Nitride, Aluminum Gallium Nitride ($Al_xGa_{1-x}N$), Indium Gallium Nitride ($In_xGa_{1-x}N$), and Aluminum Indium Gallium Nitride ($In_xAl_yGa_{1-x-y}N$), where x, y are the contents ($0 \leq x \leq 1$, $0 \leq y \leq 1$).

According to one embodiment of the present invention, the normally-off or normally-on GaN HEMT with a stacked multilayer 3D structure and related process integration method proposed, materials of the epitaxial layer include the group consisting of Silicon Carbide (SiC), Zinc Oxide (ZnO), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the content ($0 \leq x \leq 1$, $0 \leq y \leq 1$).

According to one embodiment of the present invention, the normally-off or normally-on GaN HEMT with a stacked multilayer 3D structure and related process integration method proposed, the transistor materials include the group consisting of Silicon Carbide (SiC), Zinc Oxide (ZnO), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the content ($0 \leq x \leq 1$, $0 \leq y \leq 1$).

According to one embodiment of the present invention, the normally-off or normally-on GaN HEMT with a stacked multilayer 3D structure and related process integration method proposed, where the dielectric layer may be fabricated by techniques such as sputtering, evaporation, chemical vapor deposition, and the like.

According to one embodiment of the present invention, the normally-off or normally-on GaN HEMT with a stacked multilayer 3D structure and related process integration method proposed, the materials for making the gate electrode, the source electrode and the drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

According to one embodiment of the present invention, the normally-off or normally-on GaN HEMT having a stacked multilayer 3D structure and related process integration method proposed, all etching methods include dry etching and wet etching.

According to one embodiment of the present invention, the normally-off or normally-on GaN HEMT having a stacked multilayer 3D structure and related process integration method proposed, which can be applied to both normally-off and normally-on GaN HEMTs without limiting the number of layers of the stacked HEMT device architecture.

The following paragraphs describe how to fabricate the normally-off or normally-on GaN HEMT having stacked multilayer 3D structure proposed in the present invention with reference to the accompanying drawings and embodiments.

Figure 4A:
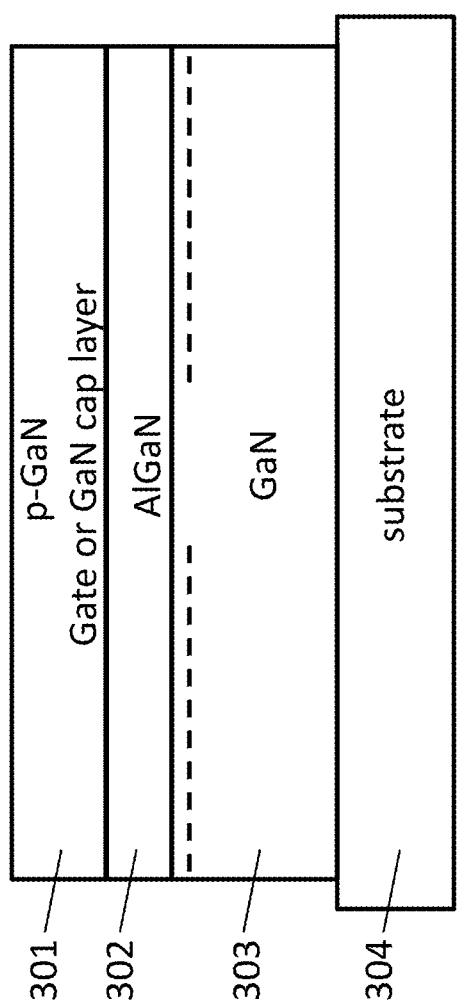
FIGS. 4(a)-4(x) show process flow for fabricating the normally-off or normally-on GaN HEMT having a stacked multilayer 3D structure according to one embodiment of the present invention.
Figure 4B:
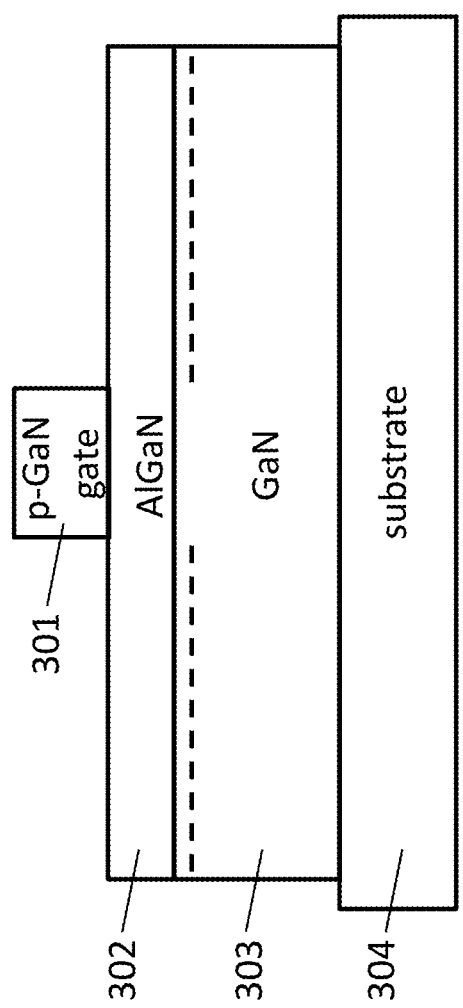
Figure 4C:
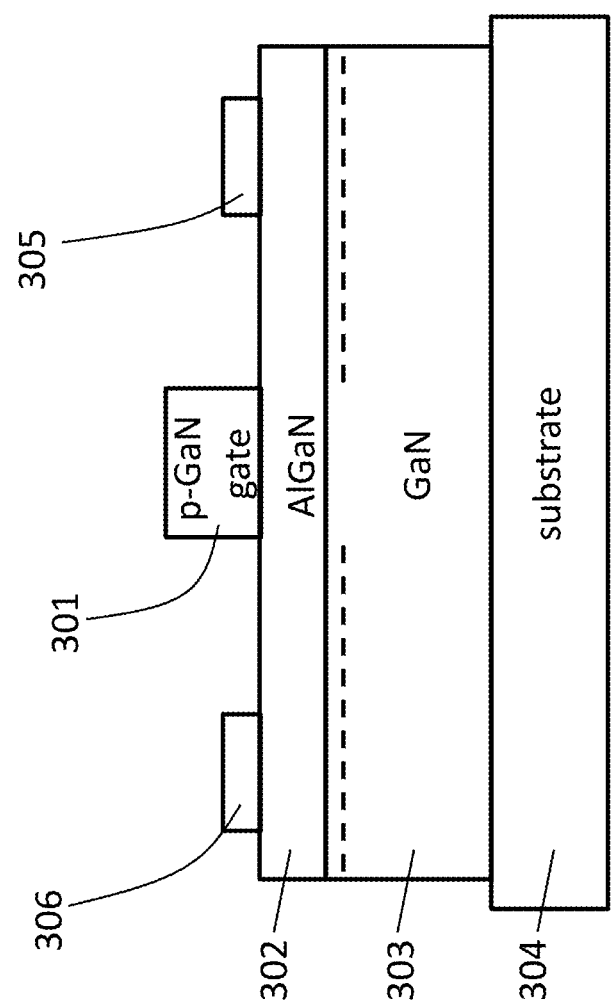
Figure 4D:
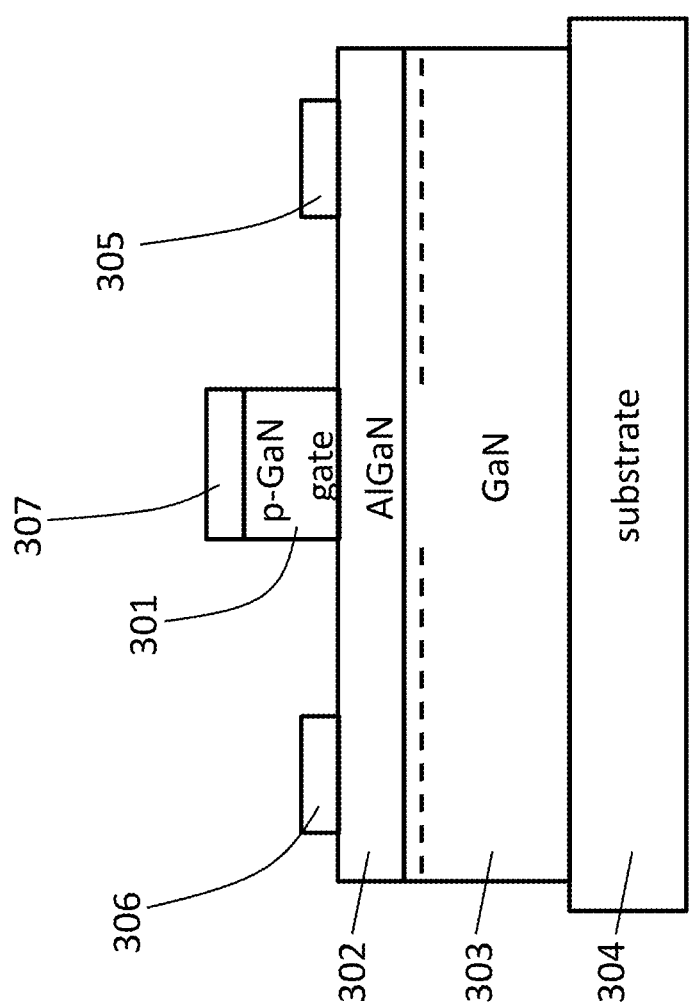
Figure 4E:
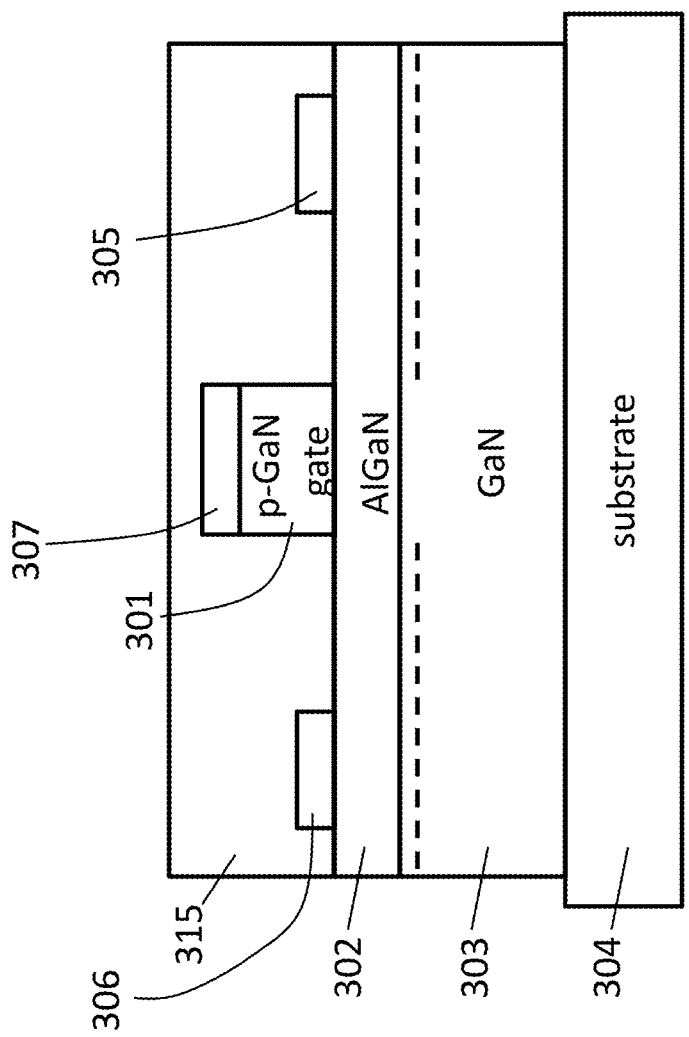
Figure 4F:
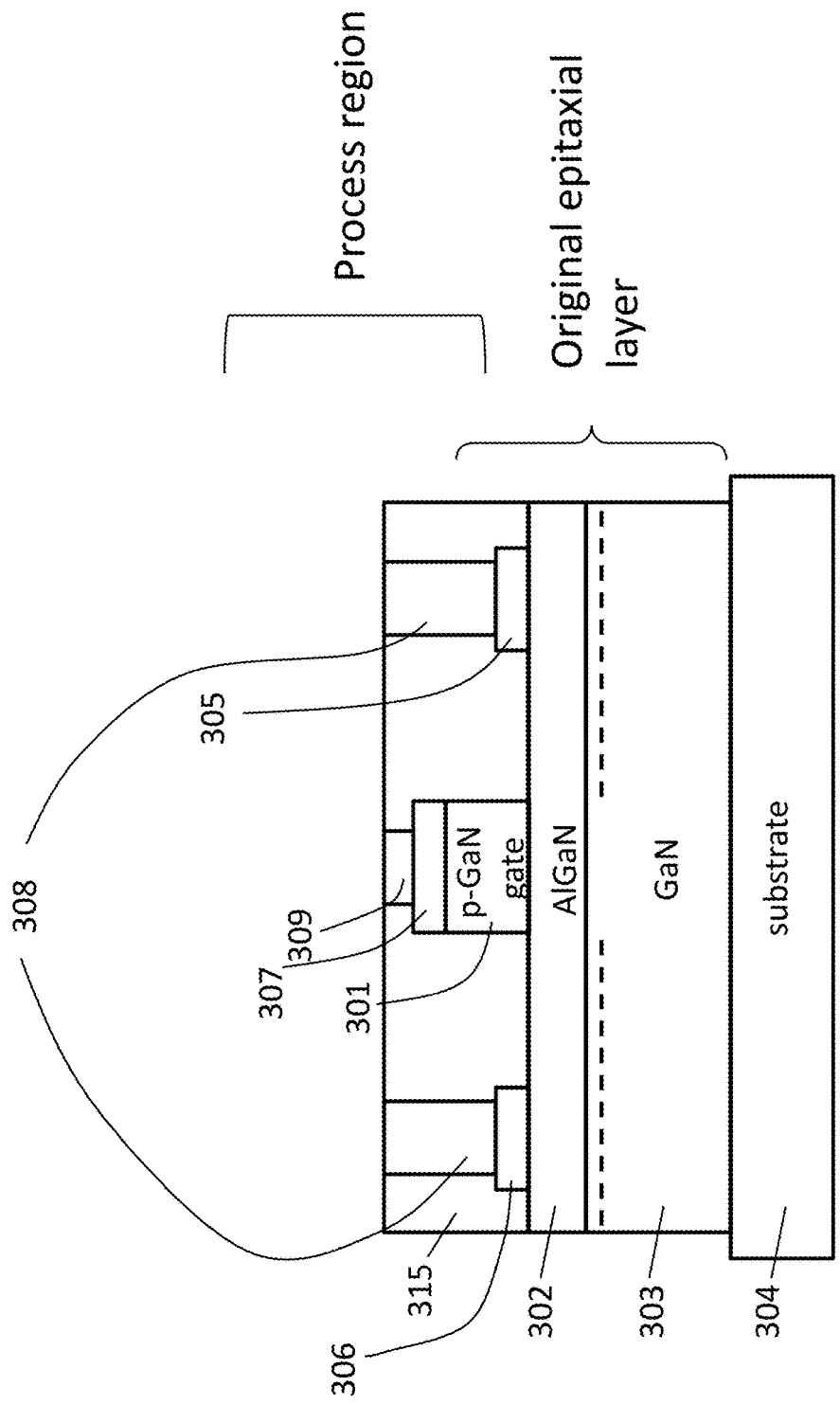
Figure 4G:
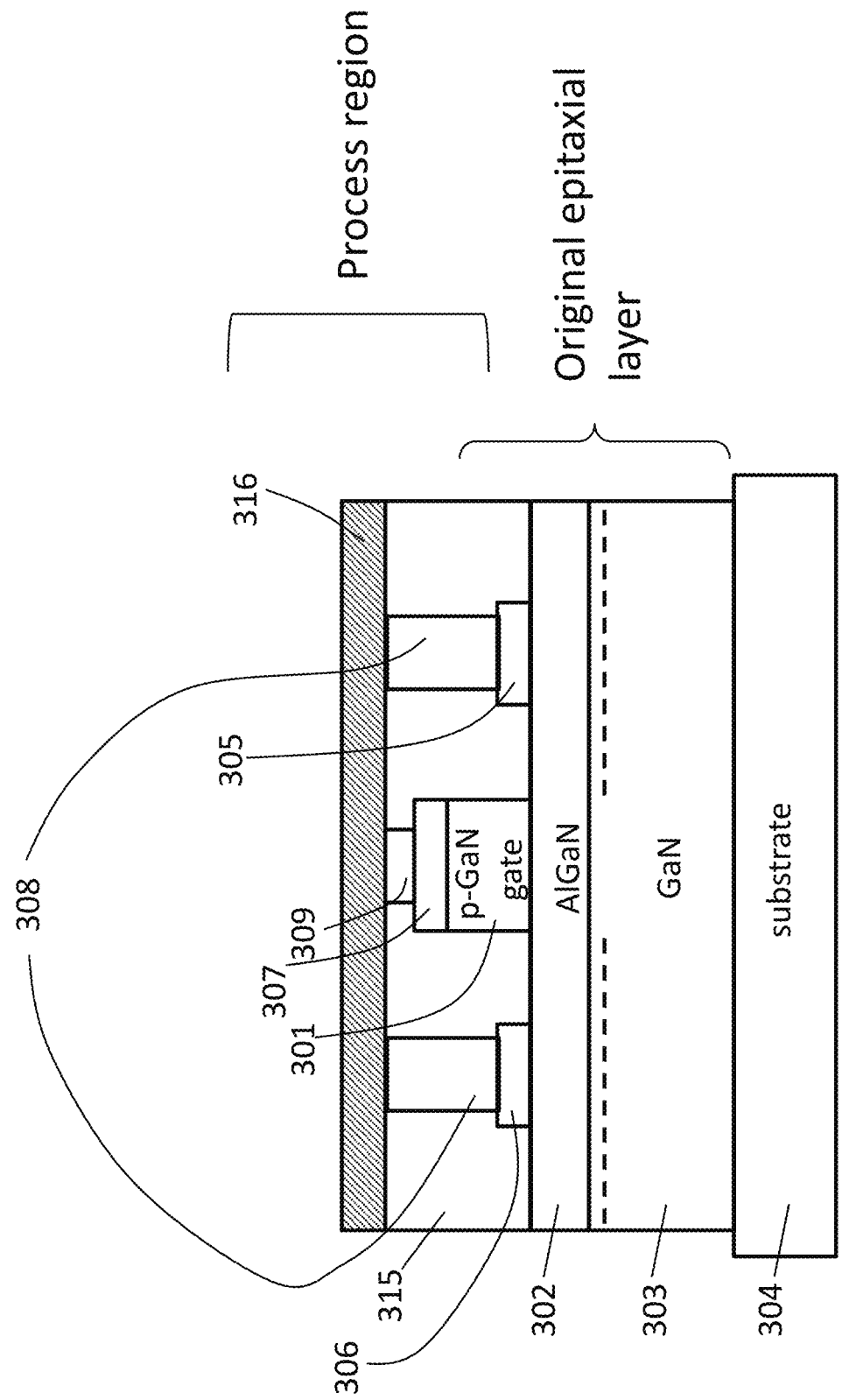
Figure 4H:
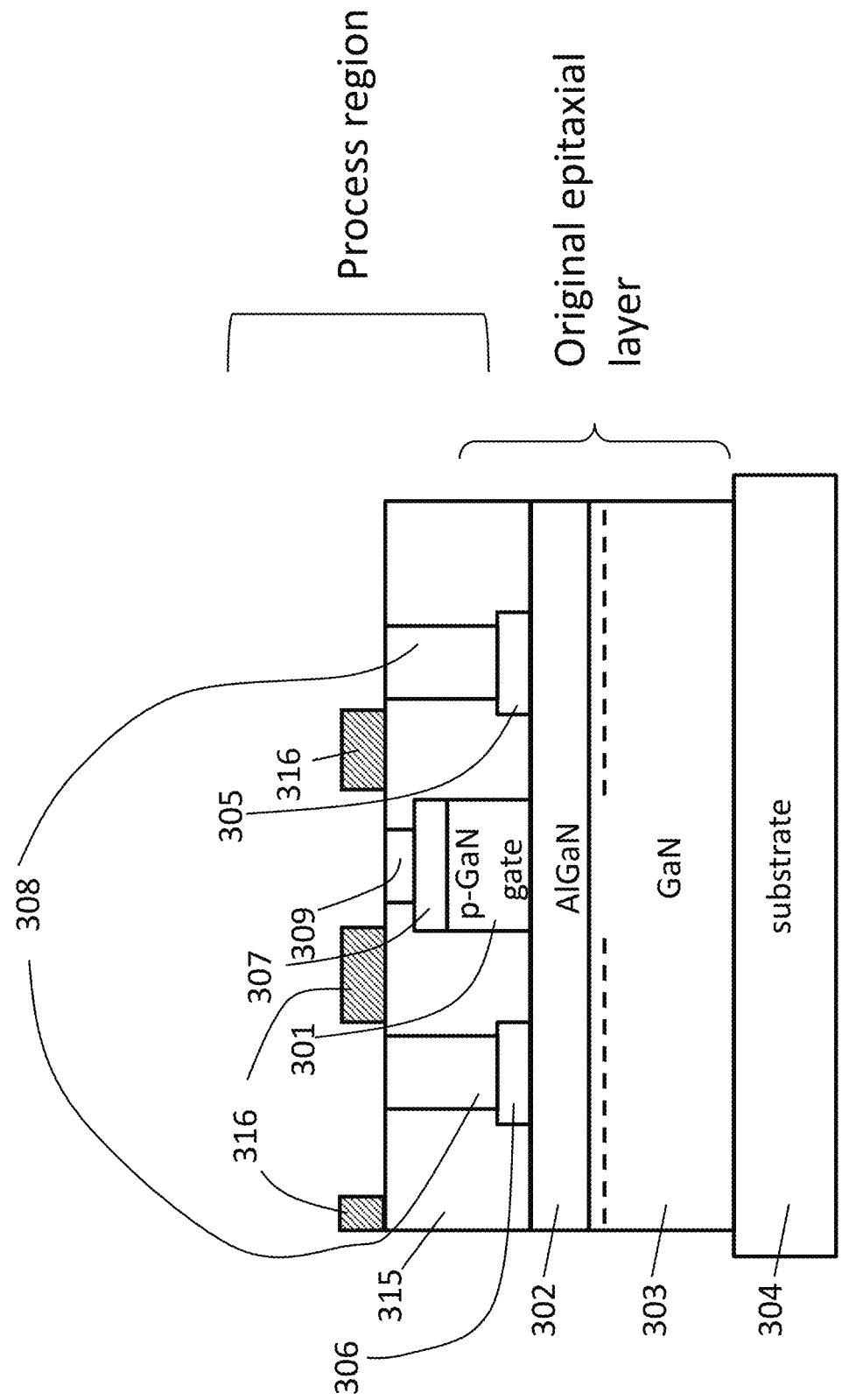
Figure 4I:
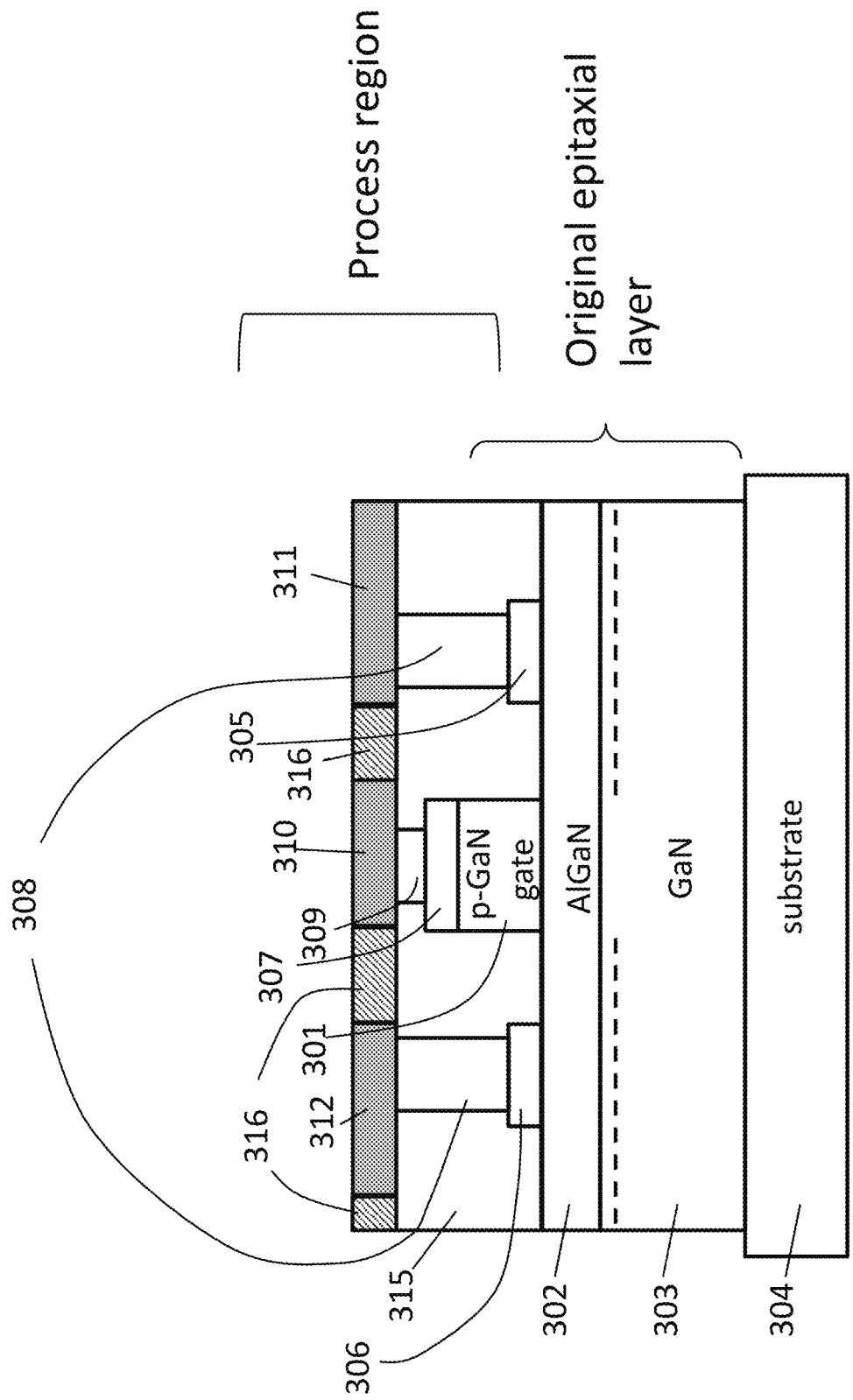
Figure 4J:
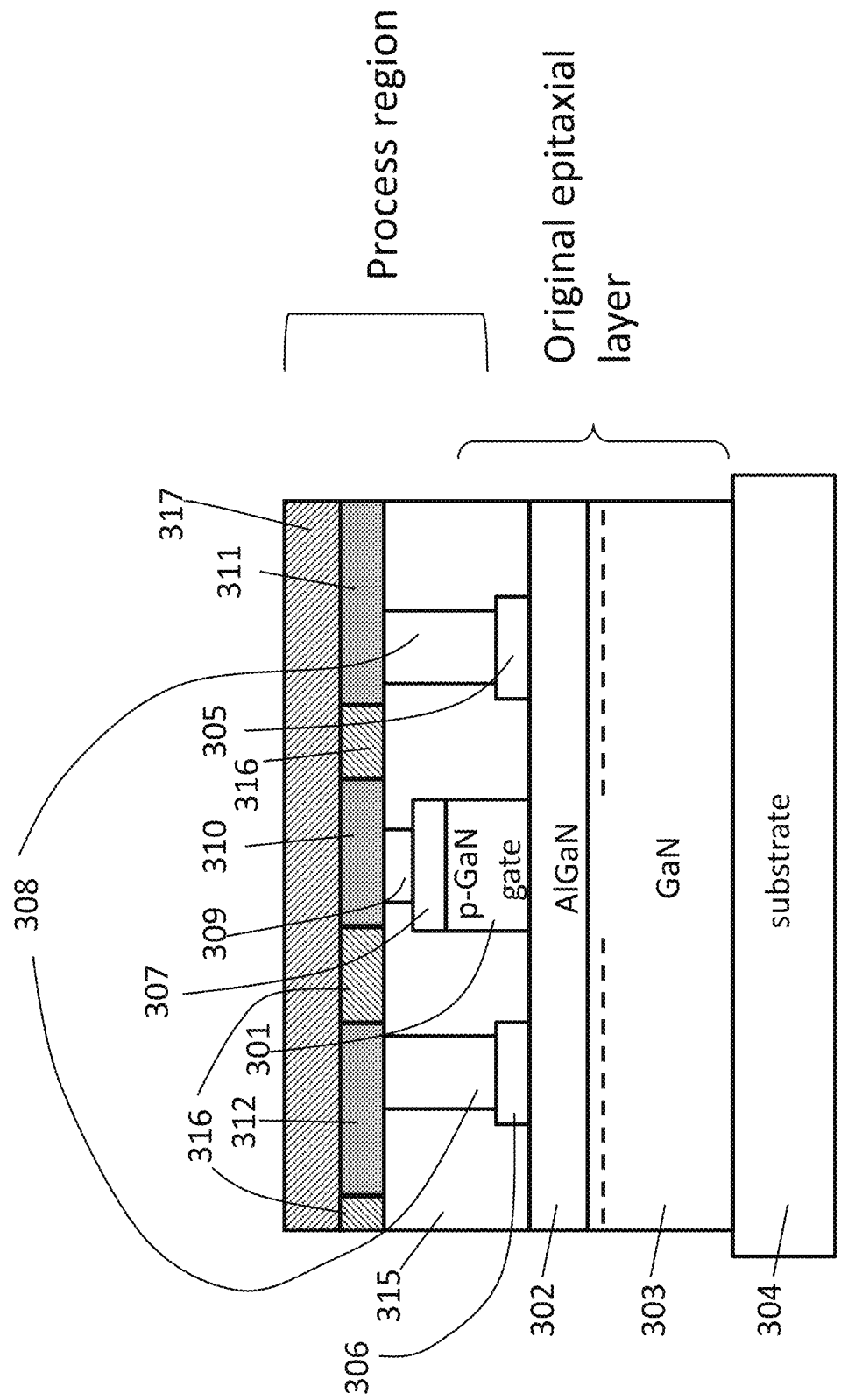
Figure 4K:
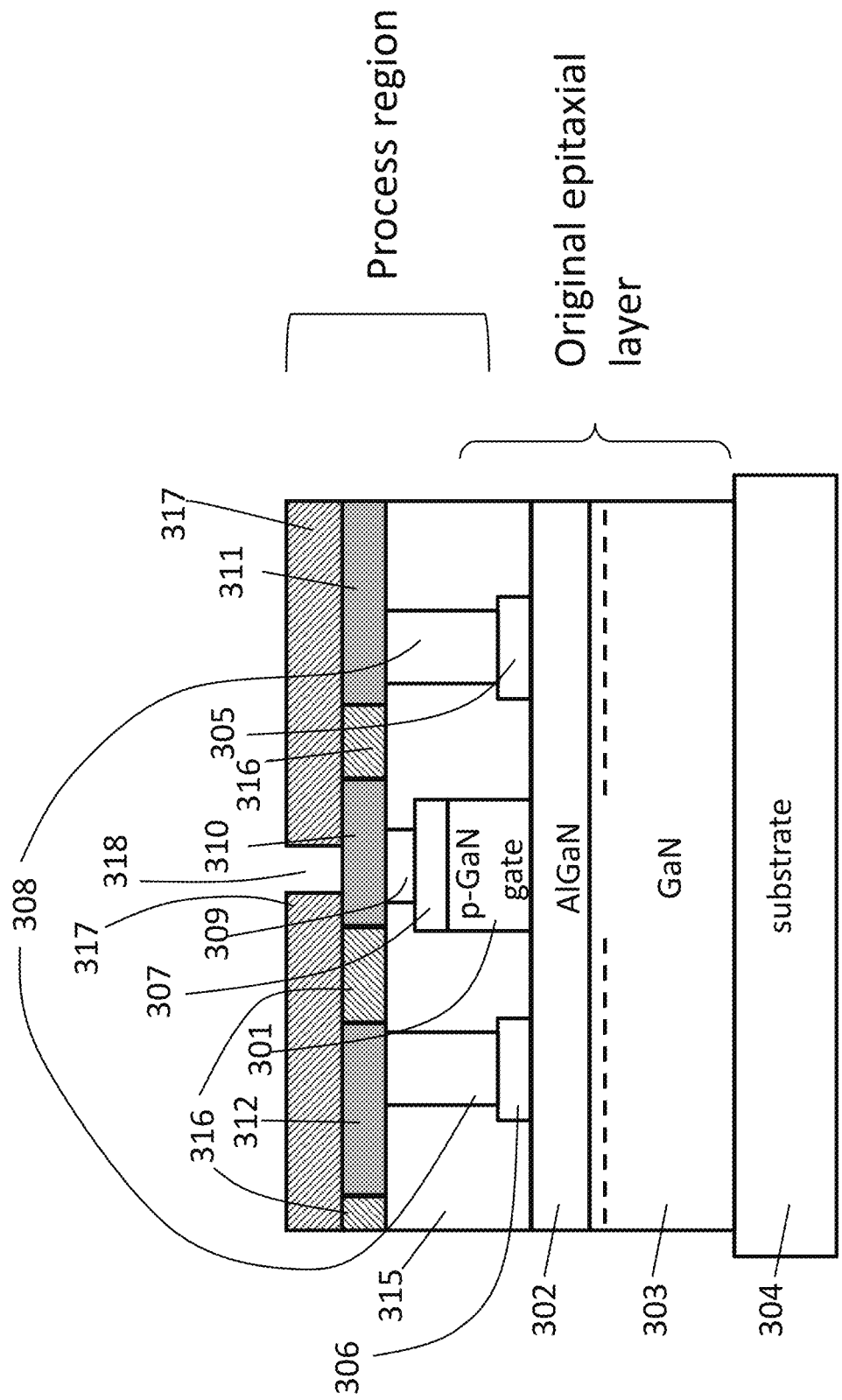
Figure 4L:
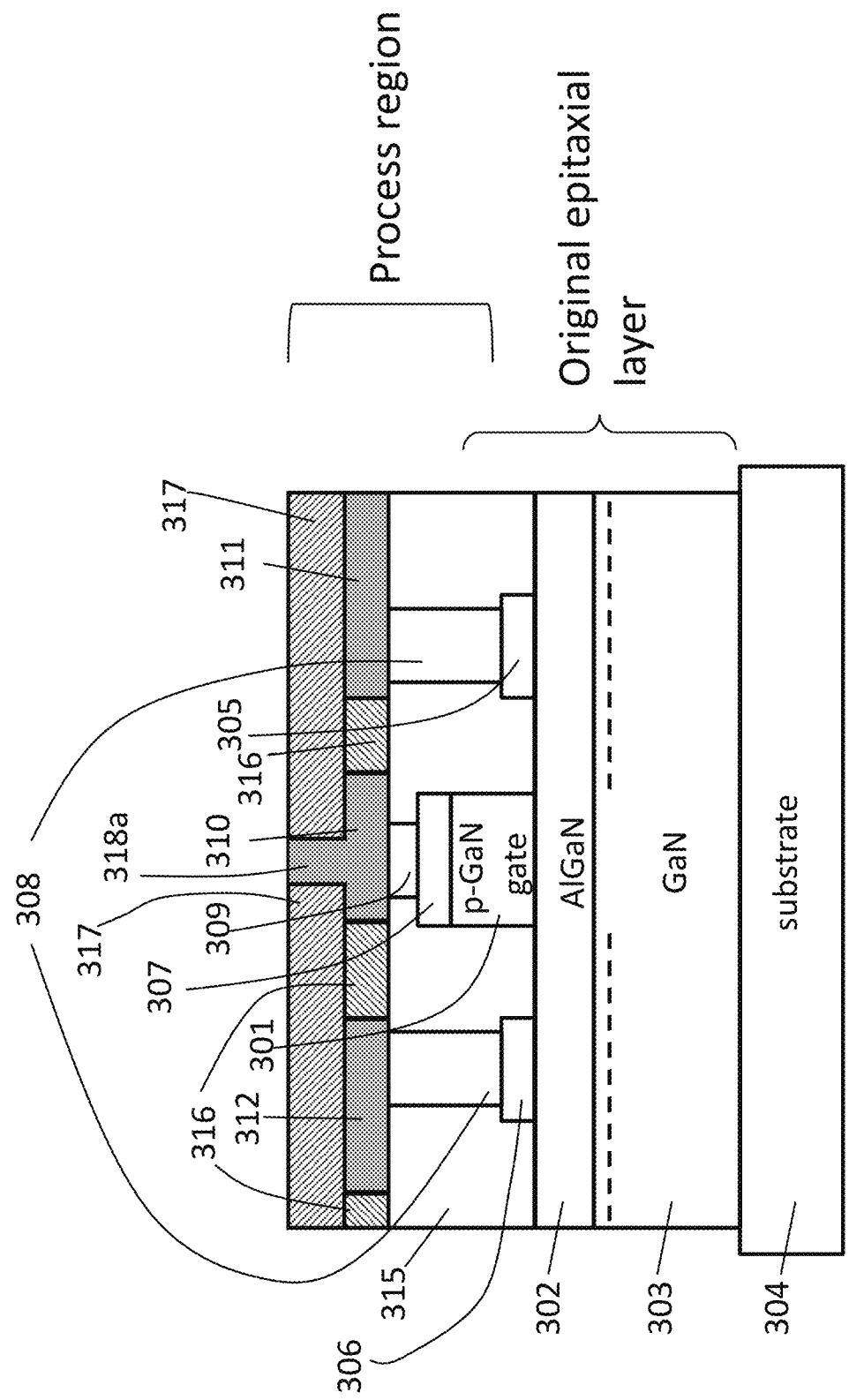
Figure 4M:
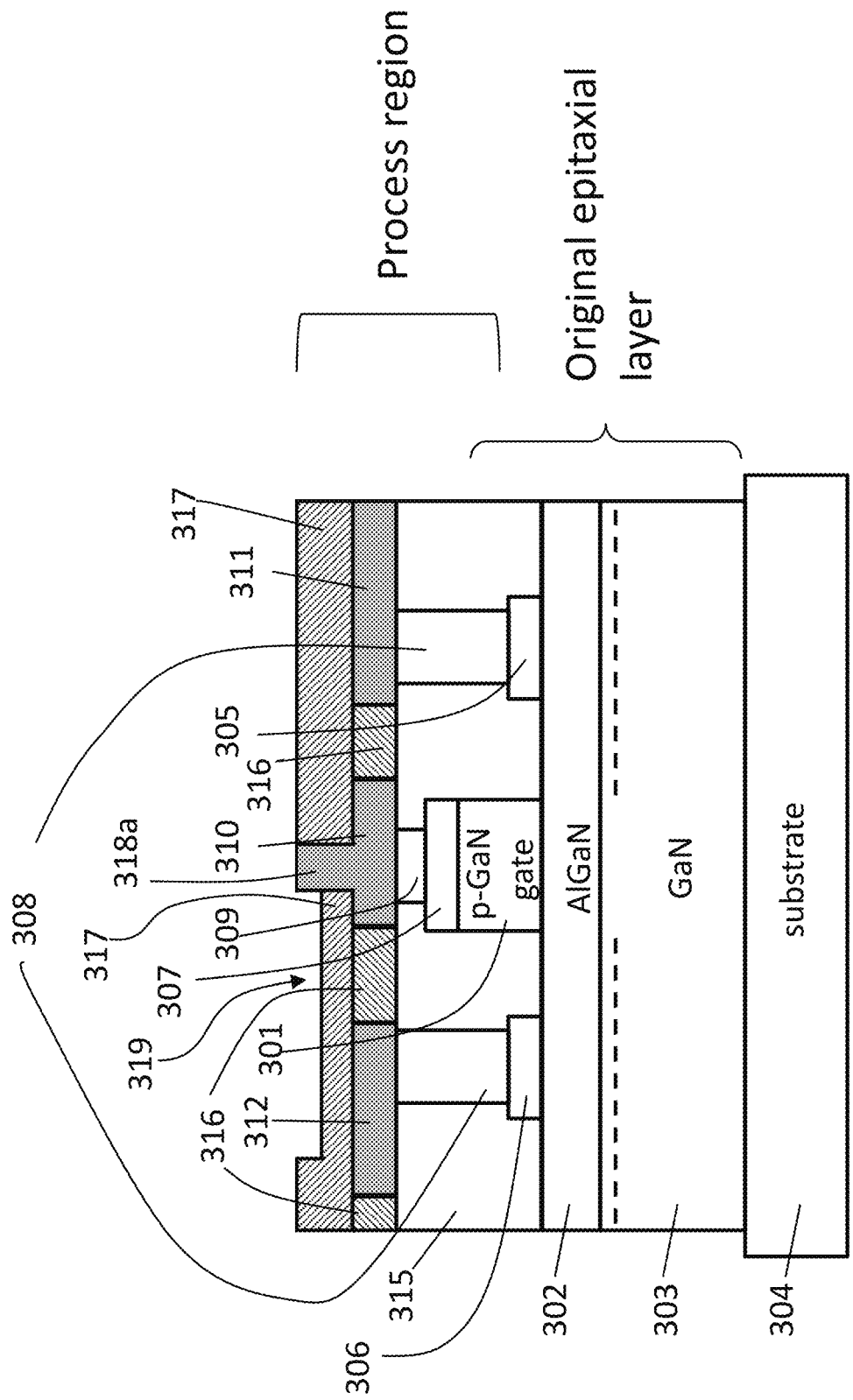
Figure 4N:
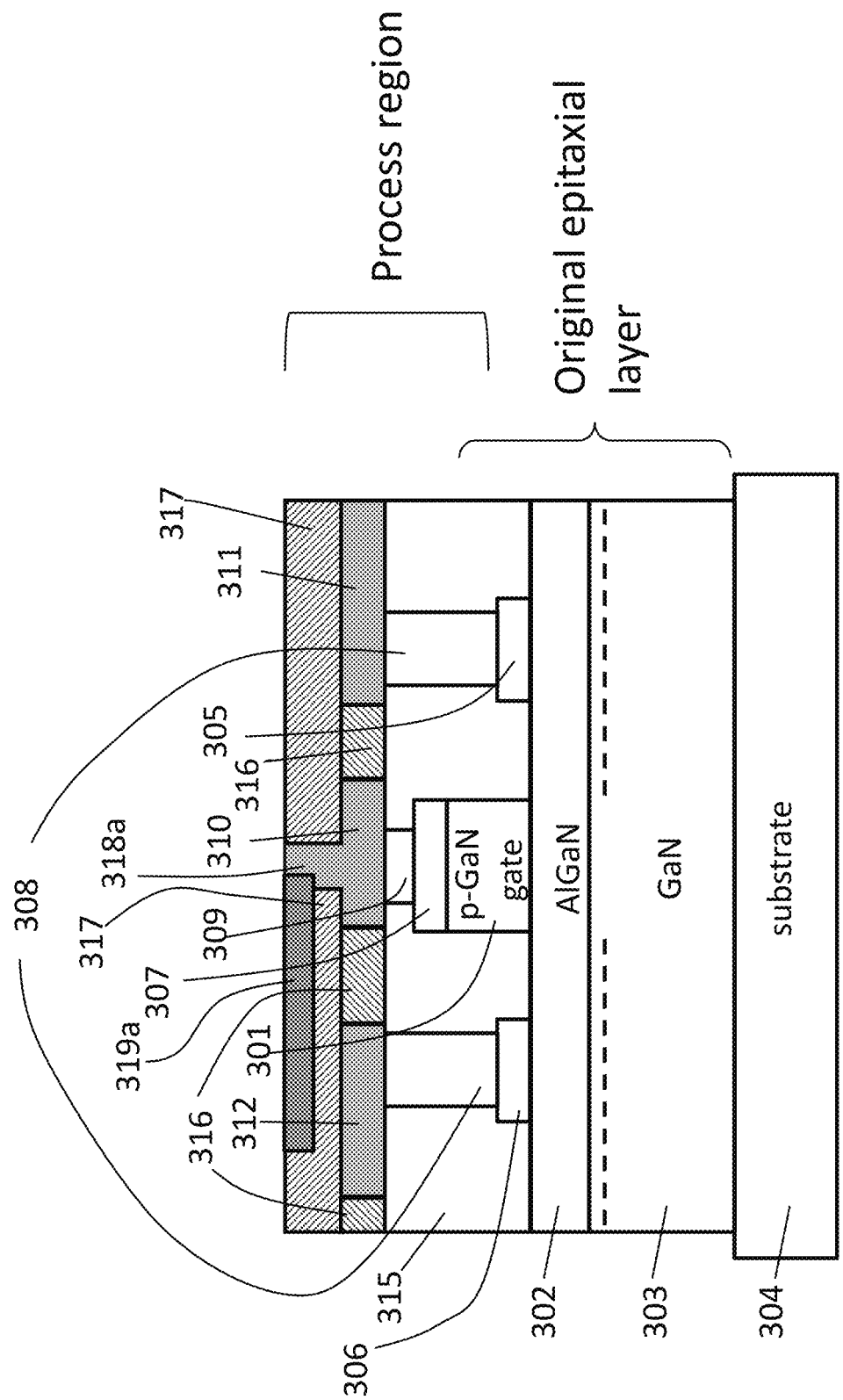
Figure 4O:
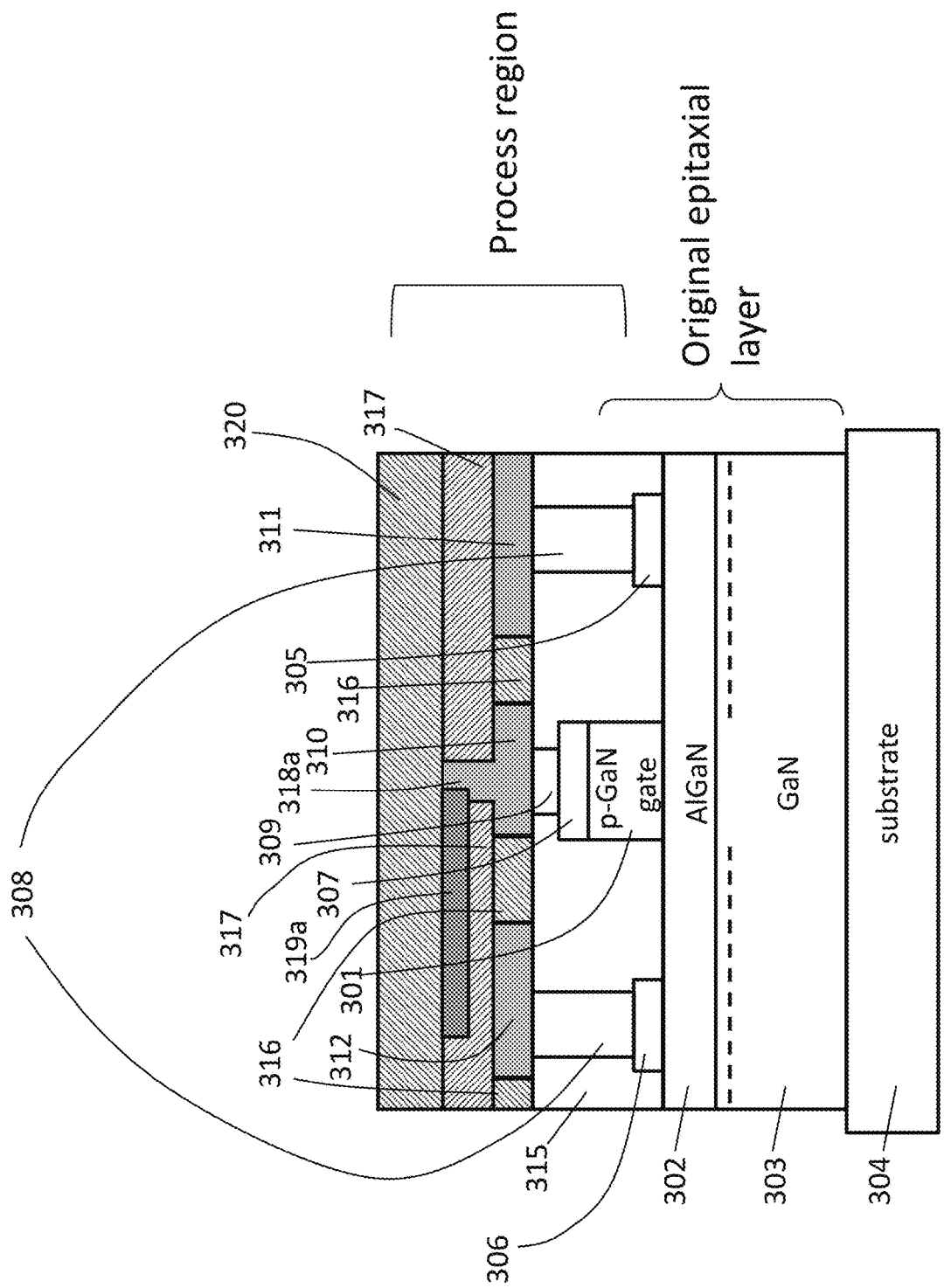
Figure 4P:
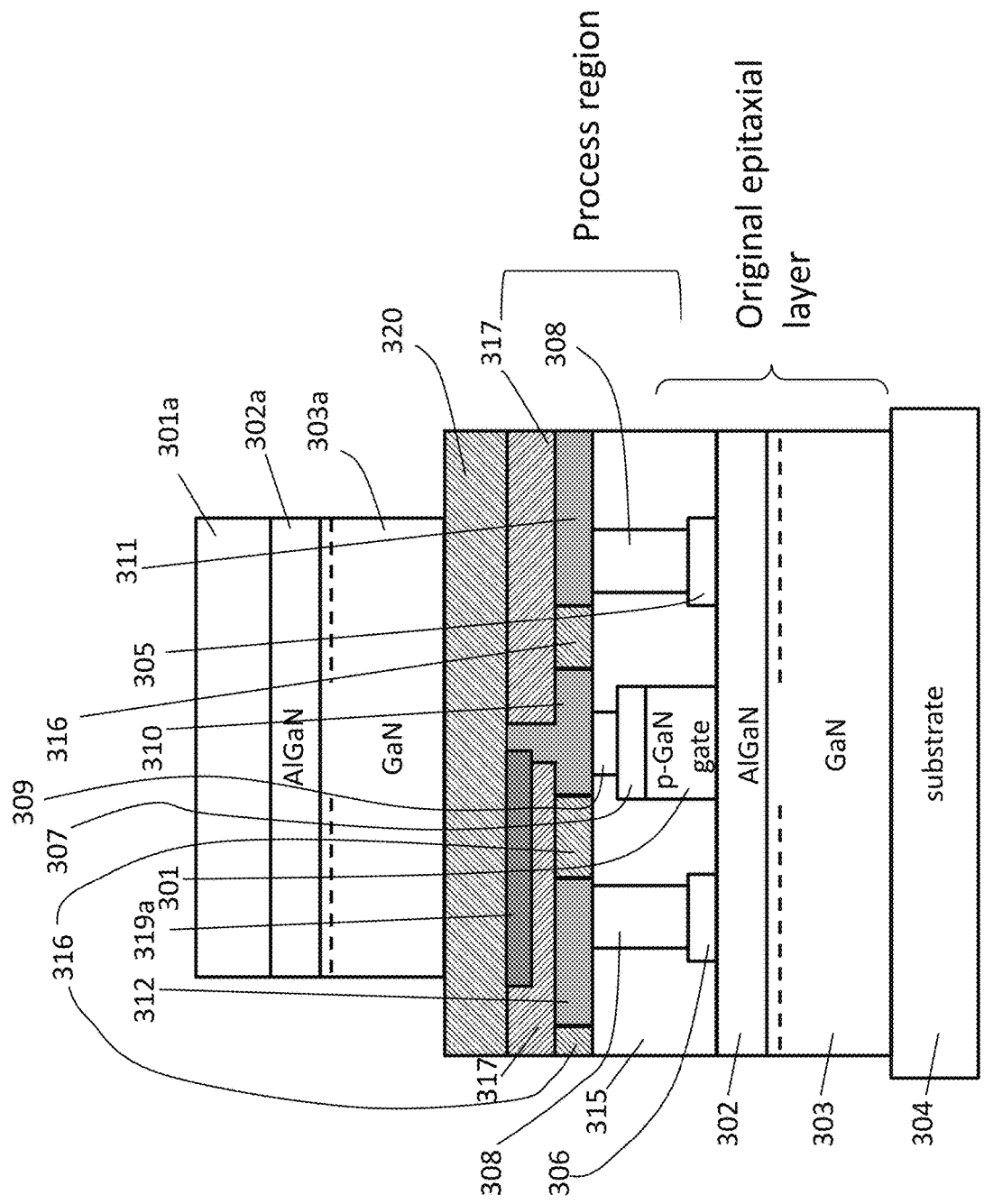
Figure 4Q:
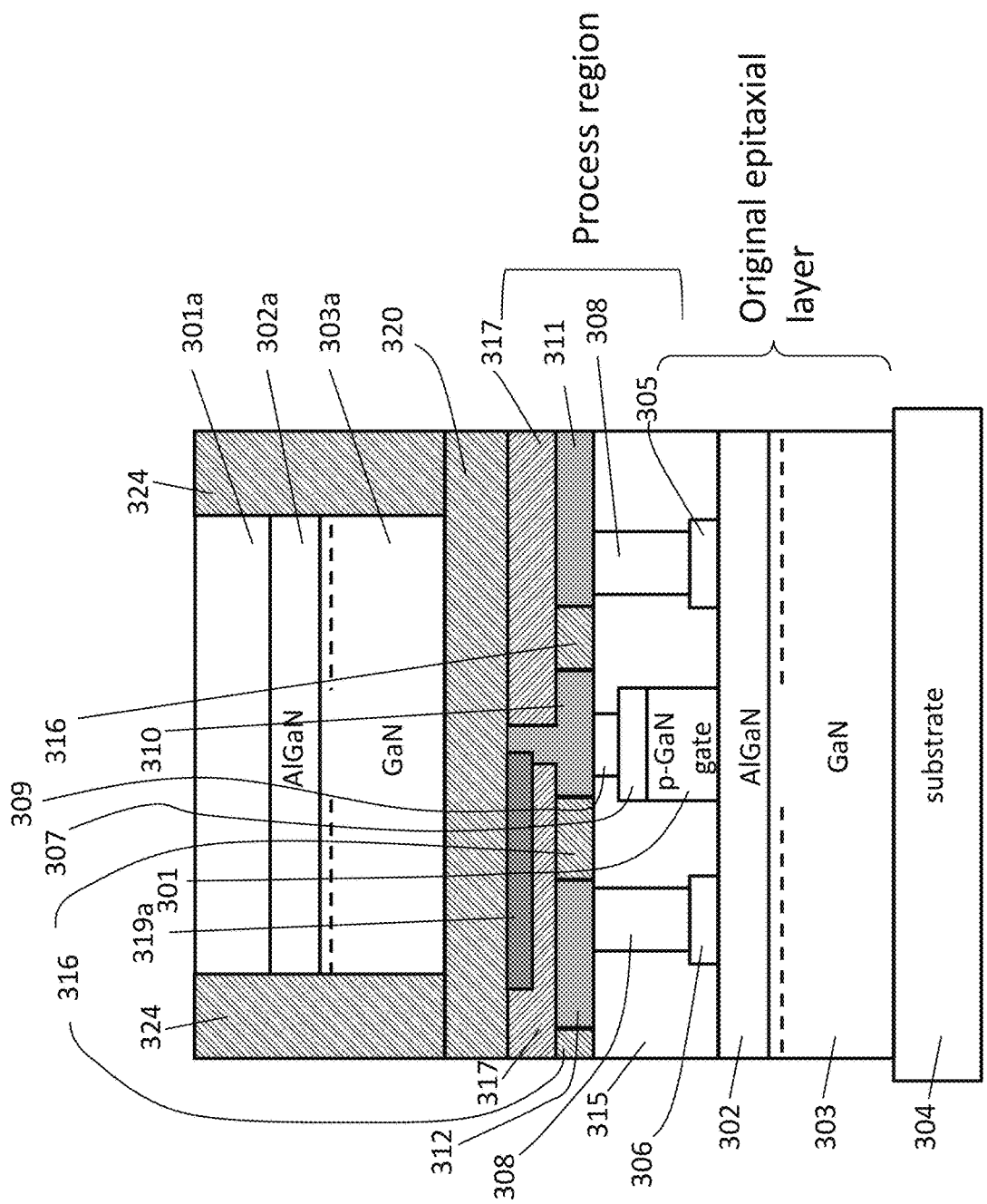
Figure 4R:
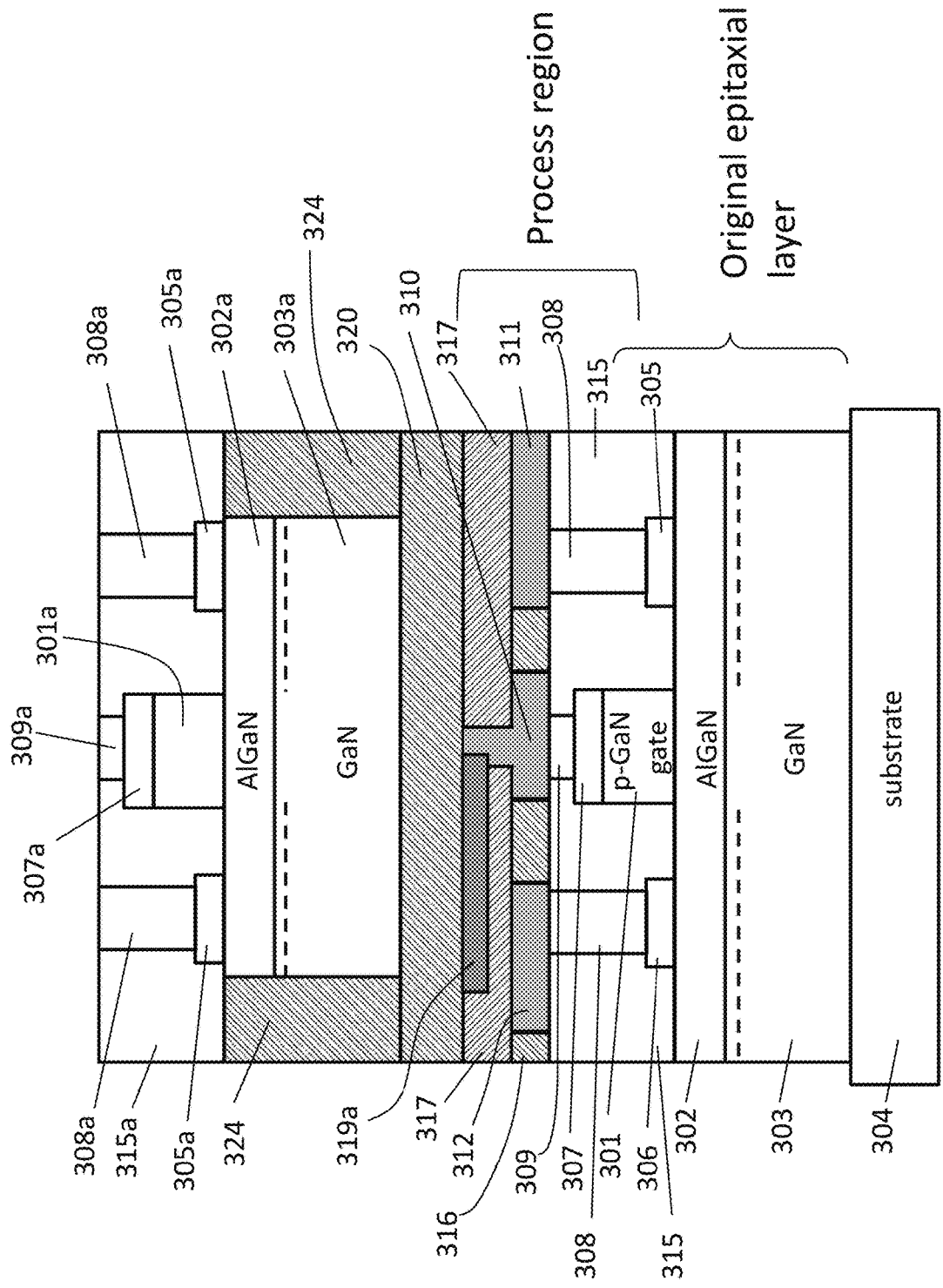
Figure 4S:
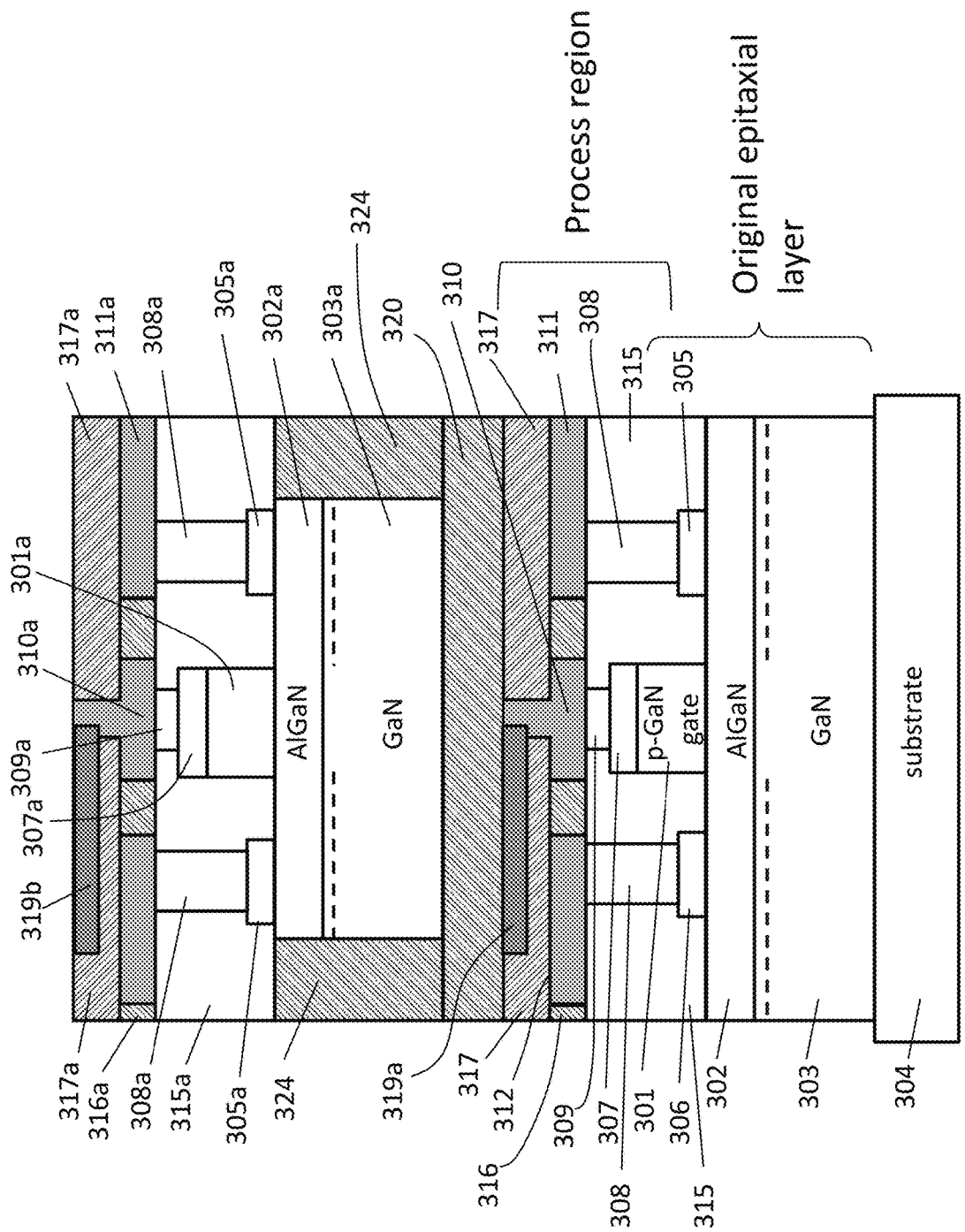
Figure 4T:
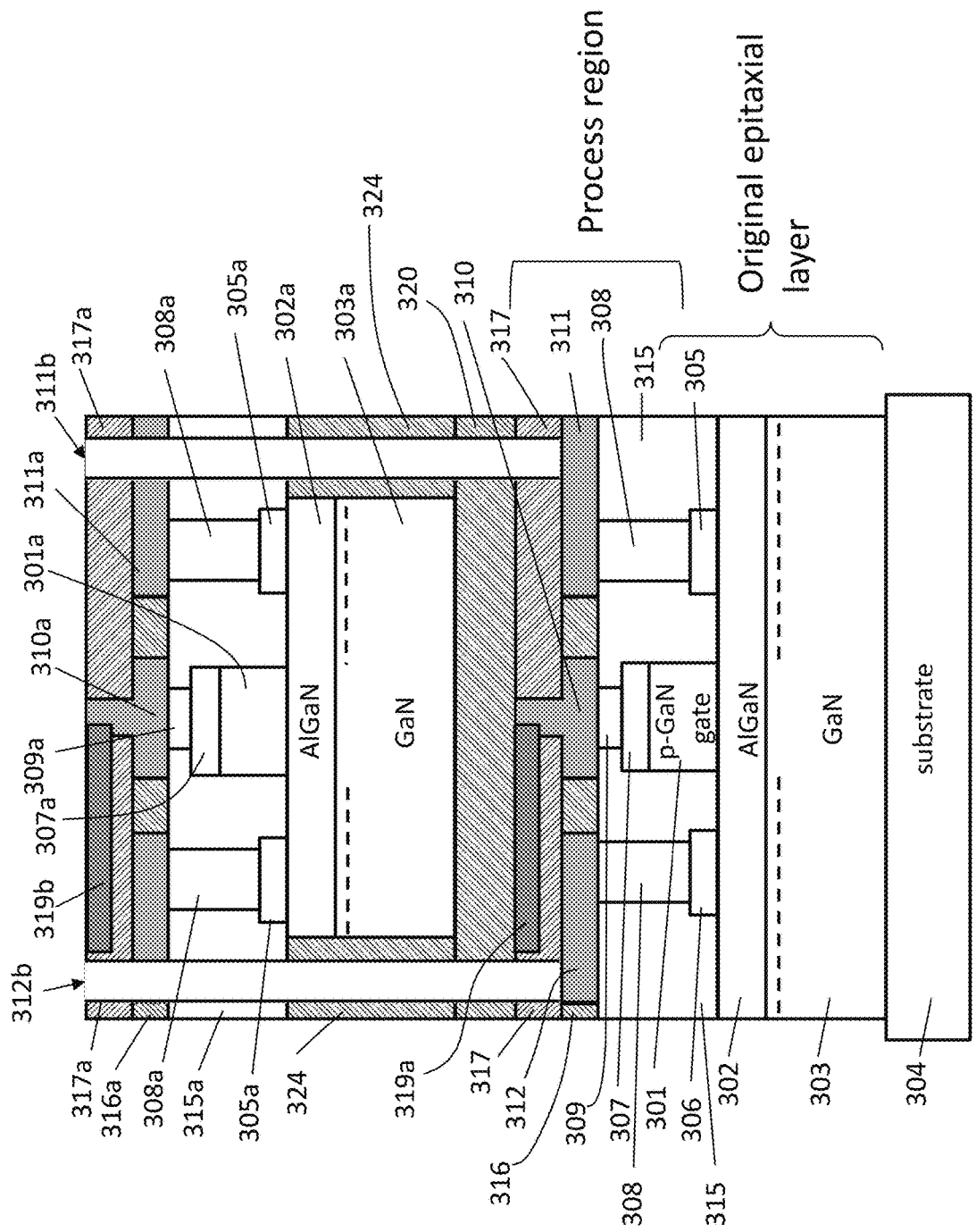
Figure 4U:
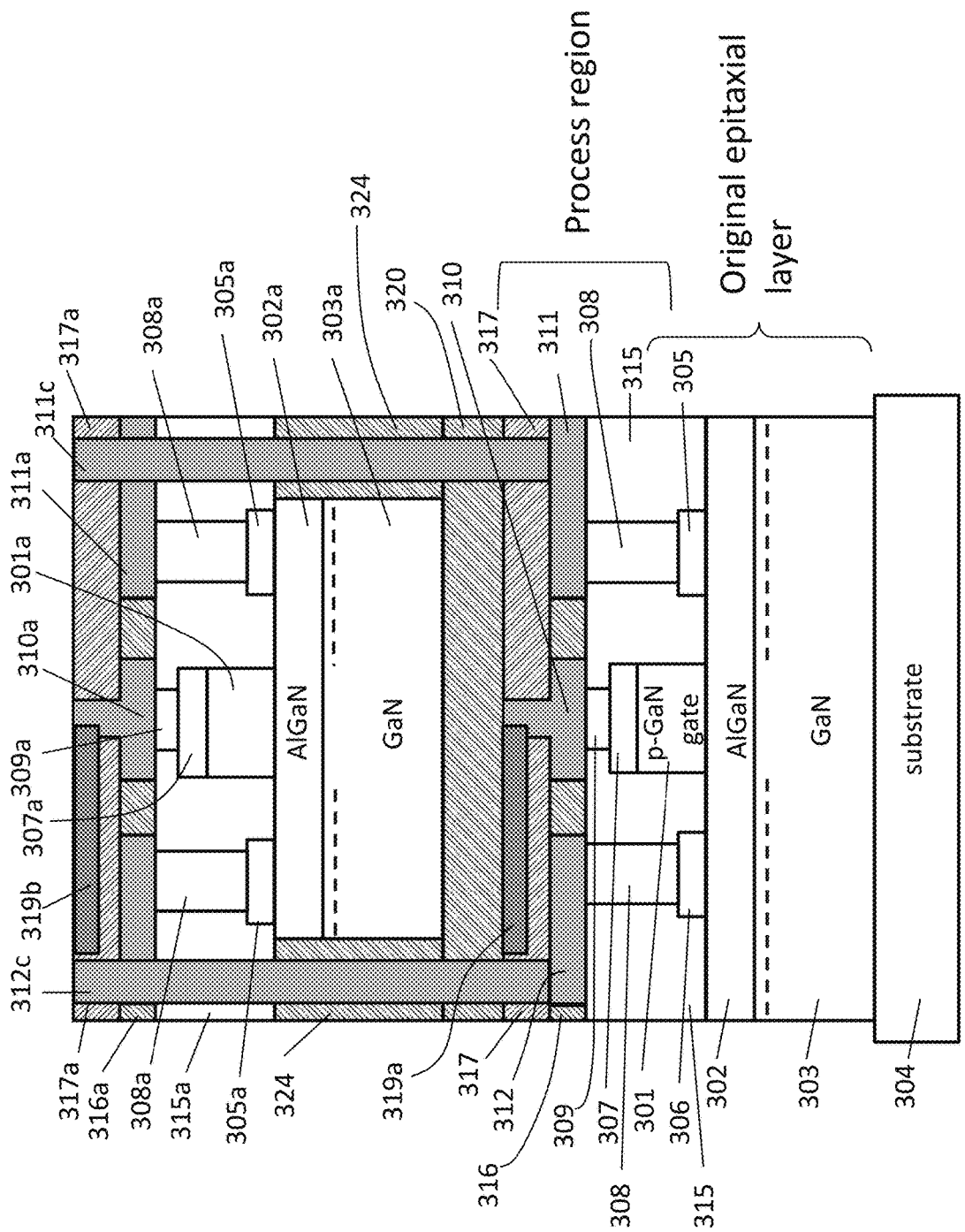
Figure 4V:
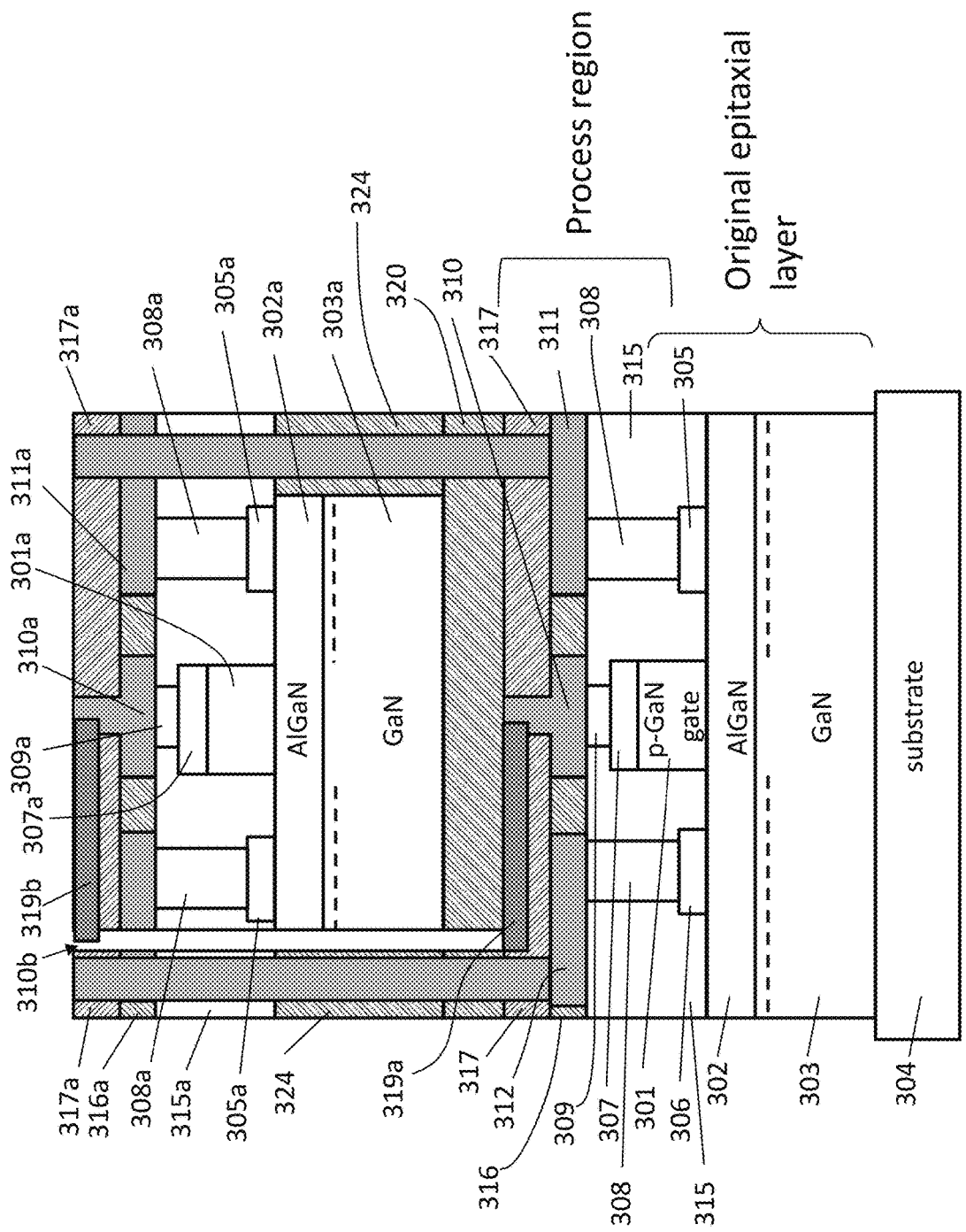
Figure 4W:
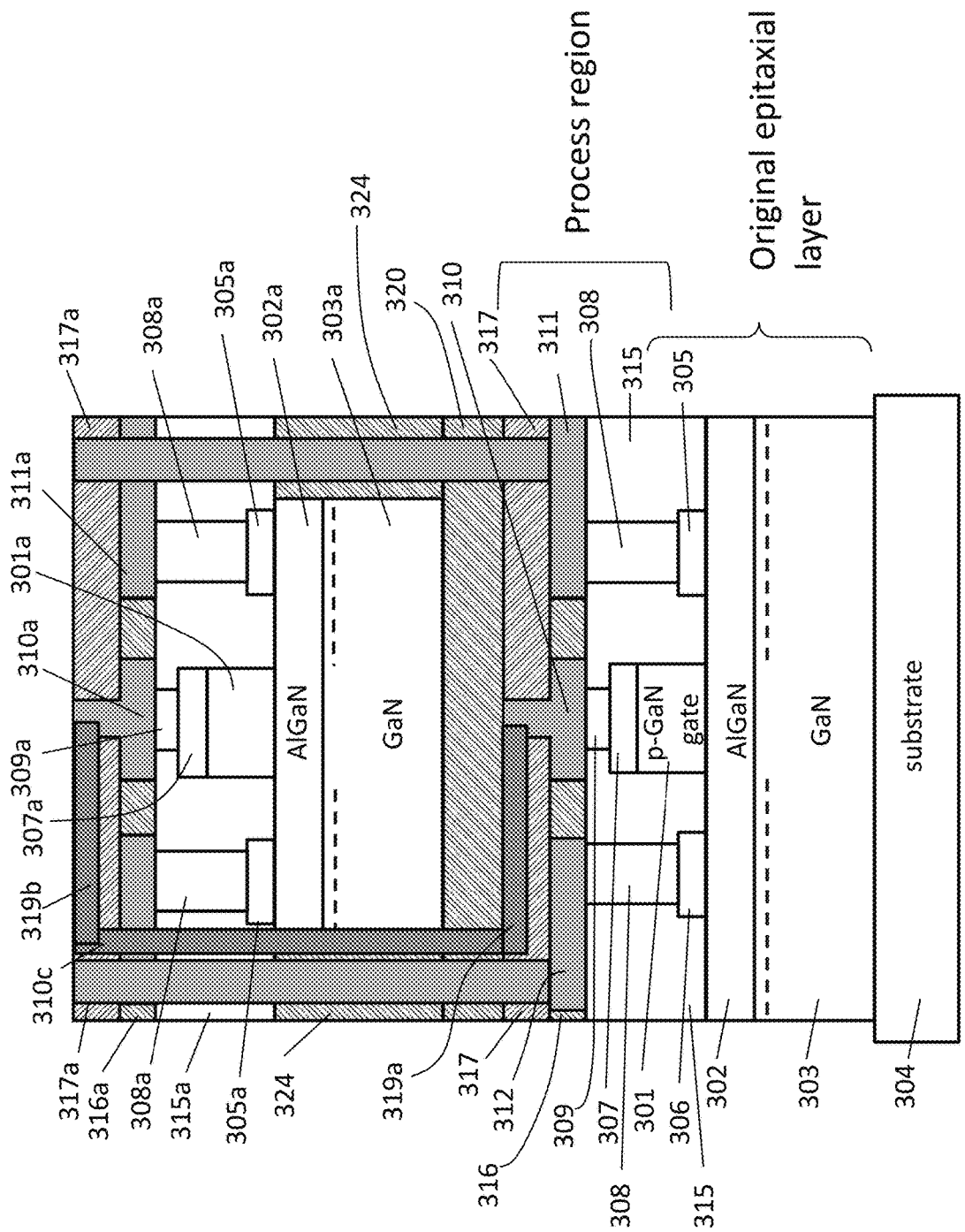
Figure 5:
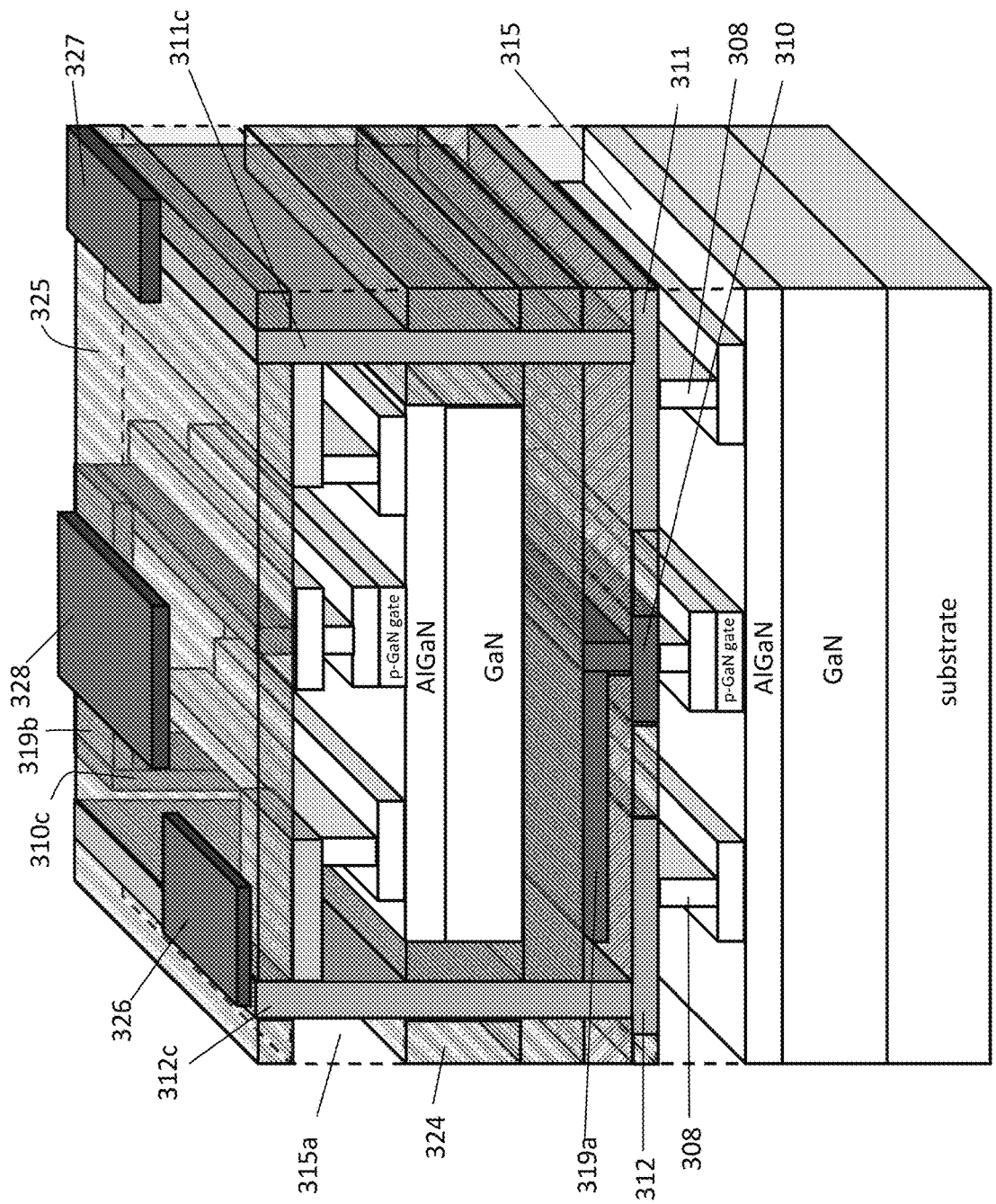
FIG. 5 shows a prospective view of forming a normally-off (or normally-on) GaN HEMT having a stacked multilayer 3D structure according to one embodiment of the present invention.

The fabrication method of the normally-off or normally-on GaN HEMT with stacked multilayer 3D structure proposed by the present invention includes the following steps:

(1) as shown in FIG. 4(a), growing a first multilayer epitaxial layers: including providing a substrate 304, and sequentially growing an n-type GaN layer 303, an n-type AlGaN layer 302, and an n-type GaN capping (CAP) layer (normally on) or a p-type GaN layer (normally off) 301 on the substrate 304, wherein an n-type gallium nitride capping (CAP) layer (normally-on) or a p-GaN layer (normally-off) 301 is also known as a doped GaN layer, and the first multilayer epitaxial layers been etched by means of a photomask (MESA) and an etching process to define the first layer device area;

(2) as shown in FIG. 4(b), utilizing a photomask (MESA) and an etching process to etch the GaN cap layer (normally-on) or p-GaN layer (normally-off) 301 to define the gate region;

(3) as shown in FIG. 4(c), fabricated the source electrode 306 and the drain electrode 305 outside the gate region;

(4) as shown in FIG. 4(d), fabricated the gate electrode 307 on top of the gate region;

(5) as shown in FIG. 4(e), depositing an oxide dielectric layer 315 to cover the gate region, the gate electrode 307, the source electrode 306 and the drain electrode;

(6) as shown in FIG. 4(f), etching part of the oxide dielectric layer 315 to form source, drain and gate contact vias, then depositing metal in the source, drain and gate contact vias to fabricate source, drain contact regions 308 and gate contact region 309;

(7) as shown in FIG. 4(g), depositing an oxide dielectric layer 316 over the source, drain contact regions 308 and the gate contact region 309;

(8) as shown in FIG. 4(h), etching part of the oxide dielectric layer 316 to define electrode connection areas for respectively connecting the source, drain contact regions 308 and the gate contact region 309;

(9) as shown in FIG. 4(i), after completing the process of etching part of the oxide dielectric layer 316 to define electrode connection areas, depositing gate metal 310, drain metal 311 and source metal 312;

(10) as shown in FIG. 4(j), depositing an oxide dielectric layer 317 over part of the oxide dielectric layer 316, gate metal 310, drain metal 311 and source metal 312;

(11) as shown in FIG. 4(k), etching part of the oxide dielectric layer 317 to define a gate electrode connect area 318;

(12) as shown in FIG. 4(l), after completing the process of etching part of the oxide dielectric layer 317 to define a gate electrode connect area 318, depositing metal in the gate electrode connect area 318 to form extended gate connection metal 318a;

(13) as shown in FIG. 4(m), etching part of the oxide dielectric layer 317 to define a lateral connection area 319 of the gate electrode;

(14) as shown in FIG. 4(n), after completing the process of step (13), depositing metal in the lateral connection area 319 of the gate electrode to form lateral connection metal 319a of the gate electrode;

(15) as shown in FIG. 4(o), depositing thick oxide dielectric layer 320 over part of the oxide dielectric layer 317, the lateral connection metal 319a of the gate electrode and the extended gate connection metal 318a;

(16) as shown in FIG. 4(p), re-growing a second layer device structure on the thick oxide dielectric layer 320 including: growing an n-type GaN layer 303a, an n-type AlGaN layer 302, and an n-type GaN capping (CAP) layer (normally on) or a p-type GaN layer (normally off) 301 on the substrate 304, and define the device area (active area) by etching the n-type GaN layer 303a, the n-type AlGaN layer 302, and the n-type GaN capping (CAP) layer (normally on) or a p-type GaN layer (normally off) 301;

(17) as shown in FIG. 4(q), depositing the etched area with an oxide dielectric layer 324;

(18) as shown in FIG. 4(r), repeating the previous steps (1) to (6) to fabricate the second layer device;

(19) as shown in FIG. 4(s), repeating the previous steps (7) to (14) to fabricate the lateral connection metal of the second layer device;

(20) as shown in FIG. 4(t), utilizing a deep etching process to define deep etched source region 312b and deep etched drain region 311b connecting each layer of devices;

(21) as shown in FIG. 4(u), performing a metal deposition process on the deeply etched source region 312b and the deeply etched drain region 311b to form the deeply etched source region metal 312c and the deeply etched drain region metal 311c;

(22) as shown in FIG. 4(v), utilizing a deep etching process to define deep etched gate region 310b connecting each layer of devices;

(23) as shown in FIG. 4(w), performing a metal deposition process on the deeply etched gate region 310b to form the deeply etched gate region metal 310c; where the connection between the deeply etched gate region metal 310c and other contact metals is staggered, and the structure of the device can be understood from the perspective view of FIG. 5.

Figure 4X:
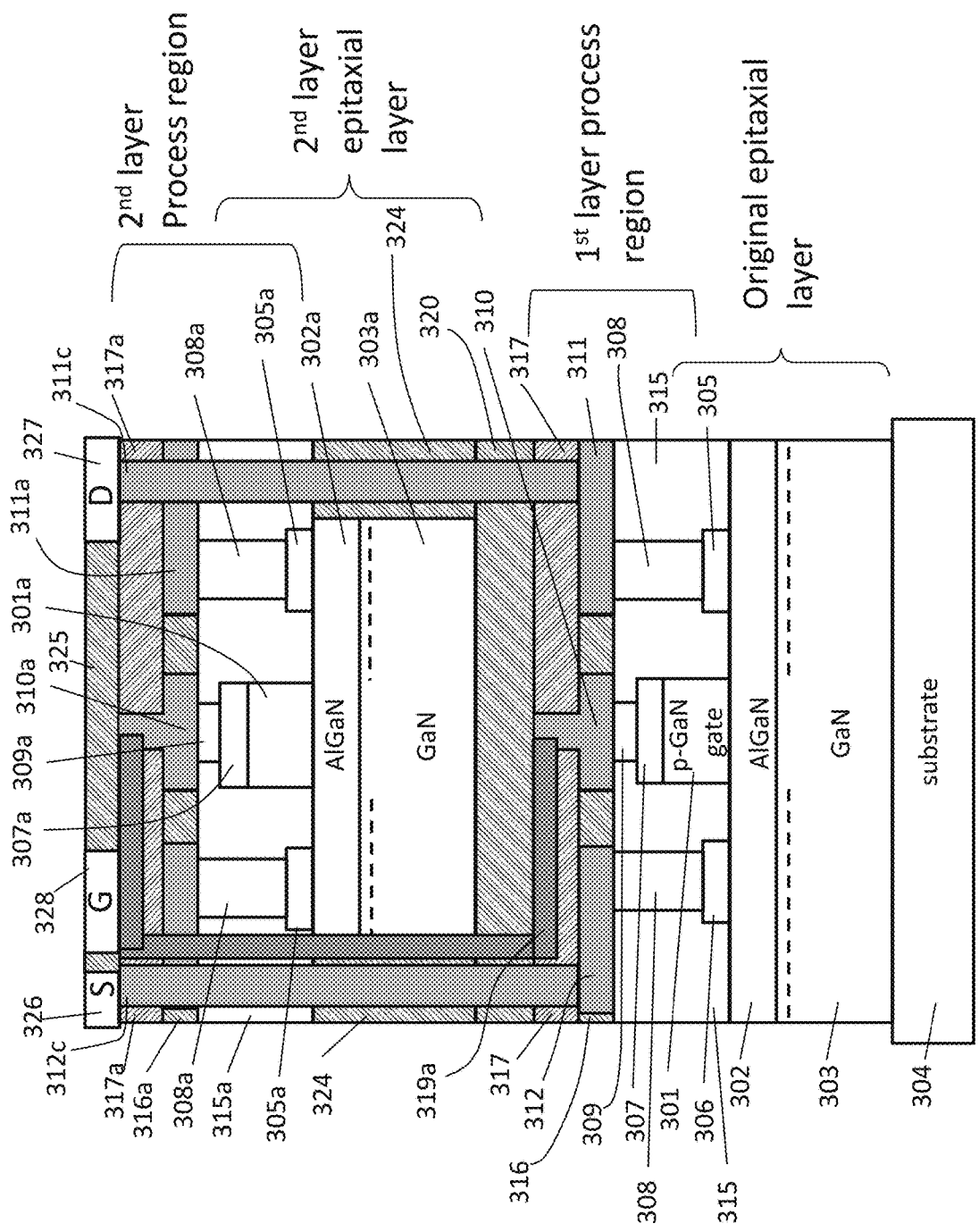

(24) as shown in FIG. 4(x), an oxide dielectric layer is deposited as the uppermost protective layer 325, and the pad (PAD) regions are defined by etching, and then metal is deposited to complete the source pad 326, the drain pad 327, and the gate pad 328 of the overall device structure.

While various embodiments of the present invention have been described above, it should be understood that they have been presented by a way of example and not limitation. Numerous modifications and variations within the scope of the invention are possible. The present invention should only be defined in accordance with the following claims and their equivalents.

What is claimed is:

1. A stacked multilayer 3D GaN high electron mobility transistor (HEMT) structure, said structure comprising:
a substrate;
a first layer GaN HEMT structure formed on said substrate, which includes:
a first n-type GaN layer, a first n-type AlGaN layer, and a first doped GaN layer arranged to form on said substrate in sequence, wherein said first doped GaN layer is a p-type GaN layer or an n-type GaN layer;

a first source electrode been formed on said first n-type AlGaN layer and making ohmic contact with said first n-type AlGaN layer,
a first drain electrode been formed on said first n-type AlGaN layer not vertically overlapping said first source electrode and making ohmic contact with said first n-type AlGaN layer, and
a first gate electrode been formed on said first doped GaN layer not vertically overlapping said first source electrode and said first drain electrode;
a first dielectric layer formed on said first layer GaN HEMT structure;
a second layer GaN HEMT structure formed on said first dielectric layer including:
a second n-type GaN layer, a second n-type AlGaN layer, and a second doped GaN layer arranged to form on said first dielectric layer in sequence, wherein said second doped GaN layer is a p-type GaN layer or an n-type GaN layer;
a second source electrode been formed on said second n-type AlGaN layer and making ohmic contact with said second n-type AlGaN layer,
a second drain electrode been formed on said second n-type AlGaN layer not vertically overlapping said second source electrode and making ohmic contact with said second n-type AlGaN layer, and
a second gate electrode been formed on said second doped GaN layer not vertically overlapping said second source electrode and said second drain electrode;
a second dielectric layer formed on said second layer GaN HEMT structure; and
a source metal interconnection structure, a drain metal interconnection structure and a gate metal interconnection structure been formed to respectively connect between said first source electrode, said first drain electrode and said first gate electrode of said first layer GaN HEMT structure and said second source electrode, said second drain electrode and said second gate electrode of said second layer GaN HEMT structure.

2. The stacked multilayer 3D GaN HEMT structure of claim 1, further including a third layer GaN HEMT structure formed on said second dielectric layer.

3. The stacked multilayer 3D GaN HEMT structure of claim 2, wherein material of said substrate includes a group consisting of Aluminum Oxide ($Al_2O_3$), Silicon Carbide (SiC), Zinc Oxide (ZnO), Silicon substrate (Si), Gallium Nitride, Aluminum Gallium Nitride ($Al_xGa_{1-x}N$), Indium Gallium Nitride ($In_xGa_{1-x}N$), and Aluminum Indium Gallium Nitride ($In_xAl_yGa_{1-x-y}N$), where x, y are the contents ($0 \leq x \leq 1$, $0 \leq y \leq 1$).

4. The stacked multilayer 3D GaN HEMT structure of claim 2, wherein method for forming said first n-type GaN layer, said first n-type AlGaN layer, said first doped GaN layer, said second n-type GaN layer, said second n-type AlGaN layer and the second doped GaN layer includes molecular beam epitaxy (MBE) or metalorganic vapor phase epitaxy (MOVPE).

5. The stacked multilayer 3D GaN HEMT structure of claim 1, wherein said source metal interconnection structure, said drain metal interconnection structure and said gate metal interconnection structure are fabricated by deep etching and metal deposition processes.

6. The stacked multilayer 3D GaN HEMT structure of claim 1, wherein materials for making said first source electrode, said first drain electrode, said gate electrode, said second source electrode, said second drain electrode, and said second gate electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

7. A method for fabricated a stacked multilayer 3D GaN high electron mobility transistor (HEMT) structure, said method comprising:
providing a substrate;
forming a first layer GaN HEMT, which includes:
forming a first multilayer epitaxial structure on said substrate, said first multilayer epitaxial structure been formed by sequentially growing a first n-type GaN layer, a first n-type AlGaN layer, and a first doped GaN layer on said substrate, wherein said first doped GaN layer is a p-type GaN layer or an n-type GaN layer;
defining a first layer device area by utilizing a photomask on said first multilayer epitaxial structure, and removing said first n-type GaN layer, said first n-type AlGaN layer and said first doped GaN layer outside said first layer device area by an etching process;
defining a first layer gate region on said first doped GaN layer by a photomask, and said first doped GaN layer outside said first layer gate region been removed to expose said first n-type AlGaN layer by an etching process to form said first layer gate region;
forming a first drain metal region and a first source metal region on said first n-type AlGaN layer outside said first layer gate region;
forming a first gate metal on said first layer gate region;
forming a first protection layer on said first n-type AlGaN layer, said first drain metal, said first source metal and said first gate metal;
forming a plurality of first layer through holes in said first protective layer by a photomask and etching process for respectively connecting said first drain metal, said first source metal and said first gate metal to outside of said first protective layer;
forming a first dielectric layer to cover said first layer GaN HEMT;
forming a second layer GaN HEMT, which includes:
forming a second multilayer epitaxial structure on said first dielectric layer, said second multilayer epitaxial structure been formed by sequentially growing a second n-type GaN layer, a second n-type AlGaN layer, and a second doped GaN layer on said first dielectric layer, wherein said second doped GaN layer is a p-type GaN layer or an n-type GaN layer;
defining a second layer device area by utilizing a photomask on said first multilayer epitaxial structure, and removing said second n-type GaN layer, said second n-type AlGaN layer and said second doped GaN layer outside said second layer device area by an etching process;
defining a second layer gate region on said second doped GaN layer by a photomask, and said second doped GaN layer outside said second layer gate region been removed to expose said first n-type AlGaN layer by an etching process to form said second layer gate region;
forming a second drain metal region and a second source metal region on said second n-type AlGaN layer outside said second layer gate region;
forming a second gate metal on said second layer gate region;

forming a second protection layer on said second n-type AlGaN layer, said second drain metal, said second source metal and said second gate metal;

forming a plurality of second layer through holes in said second protective layer by a photomask and an etching process for respectively connecting said second drain metal, said second source metal and said second gate metal to outside of said second protective layer;

forming a source metal interconnection structure, a drain metal interconnection structure and a gate metal interconnection structure to respectively connect between said first source electrode, said first drain electrode and said first gate electrode of said first layer GaN HEMT structure and said second source electrode, said second drain electrode and said second gate electrode of said second layer GaN HEMT structure;

forming a second dielectric layer to cover said second layer GaN HEMT.

8. The method for manufacturing a stacked multilayer 3D GaN HEMT structure of claim 7, further including forming a third layer GaN HEMT structure on said second dielectric layer.

9. The method for manufacturing a stacked multilayer 3D GaN HEMT structure of claim 7, wherein forming said source metal interconnection structure, said drain metal interconnection structure and said gate metal interconnection structure includes utilizing a photomask and a deep etching process.

10. The method for manufacturing a stacked multilayer 3D GaN HEMT structure of claim 8, further including forming a corresponding metal interconnection structure connecting source electrode, drain electrode and gate electrode of each layer of said GaN HEMT structure.

11. The method for manufacturing a stacked multilayer 3D GaN HEMT structure of claim 8, further including forming the uppermost dielectric layer as a protective layer.

12. The method for manufacturing a stacked multilayer 3D GaN HEMT structure of claim 10, wherein said corresponding metal internal connection structures connecting said source electrode, said drain electrode and said gate electrode of each layer of said GaN HEMT structure are staggered and do not vertically overlap each other.

13. The method for manufacturing a stacked multilayer 3D GaN HEMT structure of claim 11, wherein said uppermost dielectric layer is etched to expose said corresponding metal interconnection structure to form PAD regions and then a metal deposition process is performed to form a source PAD, a drain PAD and gate PAD over said uppermost dielectric layer.

* * * * *